United States Patent
Toyotaka

(10) Patent No.: US 8,847,933 B2
(45) Date of Patent: Sep. 30, 2014

(54) DISPLAY DEVICE

(71) Applicant: Semiconductor Energy Laboratory Co., Ltd., Atsugi (JP)

(72) Inventor: Kouhei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 62 days.

(21) Appl. No.: 13/687,744

(22) Filed: Nov. 28, 2012

(65) Prior Publication Data

US 2013/0135278 A1 May 30, 2013

(30) Foreign Application Priority Data

Nov. 30, 2011 (JP) ................................ 2011-261106

(51) Int. Cl.
*G09G 5/00* (2006.01)
*G09G 3/30* (2006.01)

(52) U.S. Cl.
CPC ................. *G09G 3/30* (2013.01); *Y02B 20/343* (2013.01); *Y02B 20/346* (2013.01)
USPC .............. 345/204; 345/211; 345/76; 345/100

(58) Field of Classification Search
CPC .............. G09G 3/3233; G09G 3/3266; G09G 2310/0286; G09G 3/3688; G09G 3/30; G09G 3/3225
USPC ......... 345/36, 39, 44–46, 55, 76–83, 87–100, 345/204–211; 377/64–81; 313/463; 315/169.3
See application file for complete search history.

(56) References Cited

U.S. PATENT DOCUMENTS

| 5,528,032 A | 6/1996 | Uchiyama |
| 6,859,193 B1 | 2/2005 | Yumoto |

(Continued)

FOREIGN PATENT DOCUMENTS

| CN | 1742309 A | 3/2006 |
| EP | 1 600 924 A1 | 11/2005 |

(Continued)

OTHER PUBLICATIONS

International Search Report, PCT Application No. PCT/JP2012/002618, dated Jul. 17, 2012, 3 pages.

(Continued)

*Primary Examiner* — Hong Zhou
(74) *Attorney, Agent, or Firm* — Fish & Richardson P.C.

(57) ABSTRACT

To reduce power consumption of a display device including a scan line driver circuit formed using either n-channel transistors or p-channel transistors when the scan line driver circuit outputs, to one of two kinds of scan lines, inverted or substantially inverted signals of signals output to the other of the two kinds of scan lines. The display device includes a plurality of pulse output circuits each of which outputs a signal to one of two kinds of scan lines and a plurality of inverted pulse output circuits each of which outputs, to the other of the two kinds of scan lines, an inverted or substantially inverted signal output from the each of the pulse output circuits. The plurality of inverted pulse output circuits operate with signals used for the operation of the plurality of pulse output circuits. Thus, through current generated in the inverted pulse output circuits can be reduced.

8 Claims, 13 Drawing Sheets

(56) References Cited

U.S. PATENT DOCUMENTS

| | | |
|---|---|---|
| 6,928,136 B2 | 8/2005 | Nagao et al. |
| 7,151,278 B2 | 12/2006 | Nagao et al. |
| 7,193,591 B2 | 3/2007 | Yumoto |
| 7,365,713 B2 | 4/2008 | Kimura |
| 7,379,039 B2 | 5/2008 | Yumoto |
| 7,388,564 B2 | 6/2008 | Yumoto |
| 7,394,102 B2 | 7/2008 | Nagao et al. |
| 7,456,810 B2 | 11/2008 | Kimura |
| 7,564,433 B2 | 7/2009 | Hector et al. |
| 7,932,888 B2 | 4/2011 | Miyake |
| 8,035,109 B2 | 10/2011 | Kimura |
| 8,040,302 B2 | 10/2011 | Shin |
| 8,063,859 B2 | 11/2011 | Kimura |
| 8,232,947 B2 | 7/2012 | Kimura |
| 8,305,306 B2 | 11/2012 | Kimura |
| 2002/0190326 A1 | 12/2002 | Nagao et al. |
| 2003/0117352 A1 | 6/2003 | Kimura |
| 2004/0080474 A1 | 4/2004 | Kimura |
| 2005/0264496 A1 | 12/2005 | Shin |
| 2005/0285827 A1* | 12/2005 | Eom ............... 345/76 |
| 2006/0077134 A1 | 4/2006 | Hector et al. |
| 2006/0158394 A1* | 7/2006 | Choi ............... 345/76 |
| 2007/0124633 A1* | 5/2007 | Kim ............... 714/726 |
| 2008/0174589 A1 | 7/2008 | Nagao et al. |
| 2008/0238835 A1 | 10/2008 | Asano et al. |
| 2010/0007649 A1* | 1/2010 | Tanikame et al. ............ 345/213 |
| 2010/0123654 A1 | 5/2010 | Kimura |
| 2011/0063262 A1 | 3/2011 | Umezaki et al. |
| 2011/0193622 A1 | 8/2011 | Miyake |
| 2012/0025193 A1 | 2/2012 | Kimura |
| 2012/0236224 A1 | 9/2012 | Kimura |
| 2012/0287099 A1 | 11/2012 | Toyotaka |

FOREIGN PATENT DOCUMENTS

| | | |
|---|---|---|
| JP | 06-275697 A | 9/1994 |
| JP | 2003-101394 A | 4/2003 |
| JP | 2003-223138 A | 8/2003 |
| JP | 2005-164891 A | 6/2005 |
| JP | 2005-338837 A | 12/2005 |
| JP | 2006-106786 A | 4/2006 |
| JP | 2006-516745 A | 7/2006 |
| JP | 2008-122939 A | 5/2008 |
| JP | 2008-250093 A | 10/2008 |
| JP | 2008-287134 A | 11/2008 |
| JP | 2010-140023 A | 6/2010 |
| JP | 2010-244067 A | 10/2010 |
| JP | 2011-085918 A | 4/2011 |
| KR | 10-2005-0101182 A | 10/2005 |
| KR | 10-2010-0054729 A | 5/2010 |
| TW | 201033986 A1 | 9/2010 |
| WO | 2004/066249 A1 | 8/2004 |

OTHER PUBLICATIONS

Written Opinion, PCT Application No. PCT/JP2012/002618, dated Jul. 17, 2012, 3 pages.

International Search Report (PCT Application No. PCT/JP2012/080114) dated Dec. 25, 2012.

Written Opinion (PCT Application No. PCT/JP2012/080114) dated Dec. 25, 2012.

* cited by examiner

DISPLAY DEVICE

TECHNICAL FIELD

The present invention relates to a display device, in particular, a display device that includes a shift register which does not include n-channel transistors or p-channel transistors.

BACKGROUND ART

In known active matrix display devices, a plurality of pixels arranged in a matrix include the respective switches. Each pixel performs display in accordance with a desired potential (image signal) input through the switch.

Active matrix display devices require circuits (scan line driver circuits) that control switching of switches provided in respective pixels by controlling the potentials of scan lines. A general scan line driver circuit includes n-channel transistors and p-channel transistors in combination; however, it is also possible to form a scan line driver circuit using either n-channel transistors or p-channel transistors. Note that the general scan line driver circuit in the former case can have lower power consumption than the scan line driver circuit in the latter case. On the other hand, the scan line driver circuit in the latter case can be formed through a smaller number of manufacturing steps than the general scan line driver circuit in the former case.

When a scan line driver circuit is formed using either n-channel transistors or p-channel transistors, a potential supplied to a scan line changes from a power supply potential supplied to the scan line driver circuit. Specifically, when a scan line driver circuit is formed using only n-channel transistors, at least one n-channel transistor is provided between a scan line and a wiring that supplies a high power supply potential to the scan line driver circuit. In this case, a high potential supplied to the scan line is lower than the high power supply potential by the threshold voltage of the at least one n-channel transistor. In a similar manner, when a scan line driver circuit is formed using only p-channel transistors, a low potential supplied to the scan line is higher than a low power supply potential supplied to the scan line driver circuit.

In response to the above problem, it has been proposed to provide a scan line driver circuit which is formed using either n-channel transistors or p-channel transistors and which can supply, to a scan line, a power supply potential supplied to the scan line driver circuit, without a change.

For example, a scan line driver circuit disclosed in Patent Document 1 includes an n-channel transistor that controls electrical connection between scan lines and clock signals alternating between a high power supply potential and a low power supply potential at evenly spaced periods. When the high power supply potential is supplied to a drain of the n-channel transistor, a potential of a gate thereof can be raised owing to the capacitive coupling between the gate and a source thereof. Thus, in the scan line driver circuit disclosed in Patent Document 1, the same or substantially the same potential as the high power supply potential can be supplied from the source of the n-channel transistor to the scan lines.

The number of the switches provided in each pixel arranged in an active matrix display device is not limited to one. Some display devices include a plurality of switches in each pixel and control the switchings of the switches separately to display an image. For example, Patent Document 2 discloses a display device including two kinds of transistors (a p-channel transistor and an n-channel transistor) in each pixel, and the switchings of the transistors are controlled separately by different scan lines. In order to control the potentials of the separately provided two kinds of scan lines, two kinds of scan line driver circuits (a scan line driver circuit A and a scan line driver circuit B) are further provided. In the display device disclosed in Patent Document 2, the separately provided scan line driver circuits output signals having substantially opposite phases.

As disclosed in Patent Document 2, there also exists a display device in which a scan line driver circuit outputs, to one of two kinds of scan lines, inverted or substantially inverted signals of signals output to the other of the two kinds of scan lines. Such a scan line driver circuit is formed using either n-channel transistors or p-channel transistors. For example, the scan line driver circuit disclosed in Patent Document 1, which outputs signals to the scan lines, may output the signals to one of the two kinds of scan lines and to an inverter, and the inverter may output signals to the other of the two kinds of scan lines.

REFERENCE

[Patent Document 1] Japanese Published Patent Application No. 2008-122939

[Patent Document 2] Japanese Published Patent Application No. 2006-106786

DISCLOSURE OF INVENTION

Note that in the case where the inverter is formed using either n-channel transistors or p-channel transistors, a large amount of through current is generated, which directly leads to an increase in power consumption of the display device.

In view of the above, an object of one embodiment of the present invention is to reduce power consumption of a display device including a scan line driver circuit which is formed using either n-channel transistors or p-channel transistors in the case where the scan line driver circuit outputs, to one of two kinds of scan lines, inverted or substantially inverted signals of signals output to the other of the two kinds of scan lines.

The display device of one embodiment of the present invention includes a plurality of pulse output circuits each of which outputs a signal to one of two kinds of scan lines and a plurality of inverted pulse output circuits each of which outputs, to the other of the two kinds of scan lines, an inverted or substantially inverted signal of the signal output from the each of the pulse output circuits. The plurality of inverted pulse output circuits operate with signals used for the operation of the plurality of pulse output circuits.

Specifically, one embodiment of the present invention is a display device including a plurality of pixels arranged in m rows and n columns (m and n are natural numbers greater than or equal to 4); respective first to m-th scan lines which are electrically connected to the n pixels arranged in respective first to m-th rows and respective first to m-th inverted scan lines which are electrically connected to the n pixels arranged in respective first to m-th rows; and a shift register electrically connected to the first to m-th scan lines and the first to m-th inverted scan lines. The n pixels arranged in a k-th row (k is a natural number less than or equal to m) each include a first switch which is turned on by an input of a selection signal to the k-th scan line and a second switch which is turned on by an input of a selection signal to the k-th inverted scan line. The shift register includes first to m-th pulse output circuits and first to m-th inverted pulse output circuits. To the s-th pulse output circuit (s is a natural number less than or equal to (m−2)), a start pulse (only in a case where s is 1) or a shift pulse output from the (s−1)-th pulse output circuit is input. The s-th pulse output circuit outputs a selection signal and a shift pulse to the s-th scan line and the (s+1)-th pulse output circuit, respectively. The s-th pulse output circuit includes a first transistor and a second transistor which are turned on by an input of the start pulse or the shift pulse output from the (s−1)-th pulse output circuit and are in an on state until a first period ends. In the first period, by utilizing at least one of capacitive coupling between a gate and a source of the first transistor and capacitive coupling between a gate and a source of the second transistor, the s-th pulse output circuit supplies, as a selection signal, a potential which is the same or substantially the same as the potential supplied to a drain of the first transistor, from the source of the first transistor, and supplies, as a shift pulse, a potential which is the same or substantially the same as the potential supplied to a drain of the second transistor, from a source of the second transistor. To the s-th inverted pulse output circuit, the start pulse (only in the case where s is 1) or the shift pulse output from the (s−1)-th pulse output circuit is input. The s-th inverted pulse output circuit outputs a selection signal to the s-th inverted scan line. The s-th inverted pulse output circuit includes a third transistor which is turned off by an input of the start pulse or the shift pulse output from the (s−1)-th pulse output circuit and is in an off state until a second period ends. After the second period, the s-th inverted pulse output circuit supplies a selection signal to the s-th inverted scan line from a source of the third transistor. The first period corresponds to or is included in the second period.

In the display device of one embodiment of the present invention, the operation of the inverted pulse output circuits is controlled by a plurality of kinds of signals. Thus, through current generated in the inverted pulse output circuits can be reduced. Further, signals used for the operation of the plurality of pulse output circuits are used as the plurality of kinds of signals. That is, the inverted pulse output circuits can operate without generating a signal additionally.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the descriptions of the embodiments below.

First, a configuration example of a display device of one embodiment of the present invention will be described with reference to FIG. 1, FIG. 2, FIG. 3, FIGS. 4A and 4B, FIGS. 5A and 5B, FIGS. 6A and 6B, FIGS. 7A and 7B.

<Configuration Example of Display Device>

Figure 1:
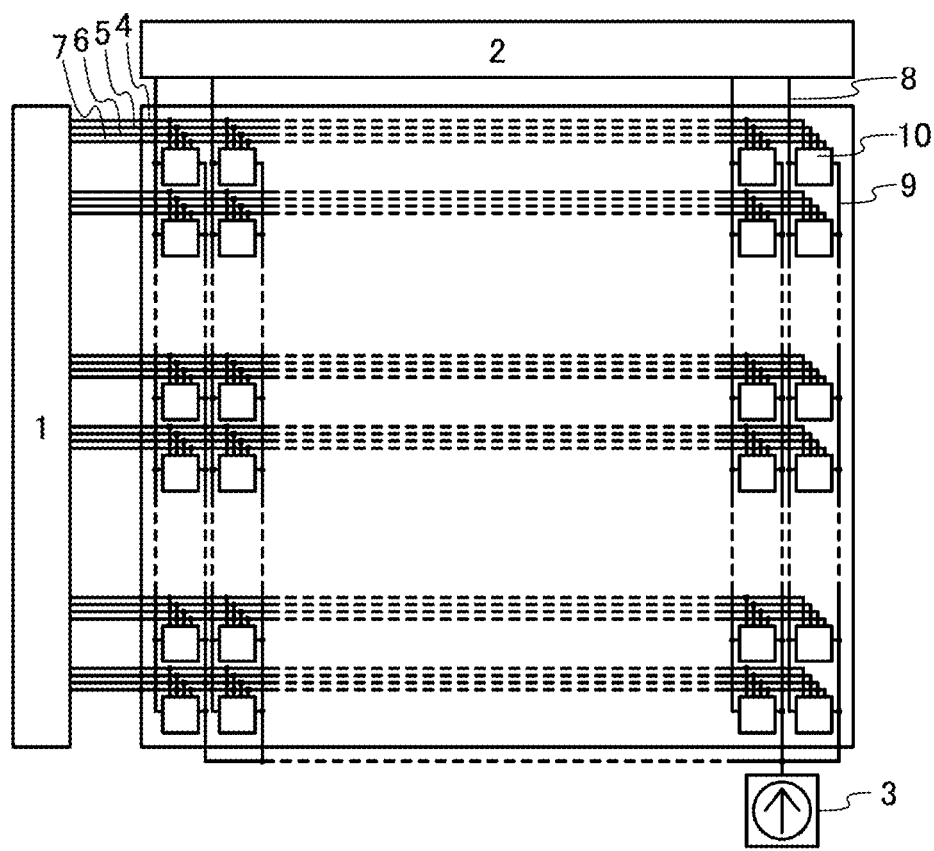
FIG. 1 illustrates a configuration example of a display device.

FIG. 1 illustrates a configuration example of a display device. The display device in FIG. 1 includes a plurality of pixels 10 arranged in m rows and n columns, a scan line driver circuit 1, a signal line driver circuit 2, a current source 3, and m scan lines 4, m scan lines 5, m scan lines 6, and m reverse scan lines 7 which are electrically connected to respective rows of the pixels 10 and whose potentials are controlled by the scan line driver circuit 1, n signal lines 8 which are electrically connected to respective columns of the pixels 10 and whose potentials are controlled by the signal line driver circuit 2, and a power supply line 9 which are provided with a plurality of branch lines and are electrically connected to the current source 3.

<Configuration Example of Scan Line Driver Circuit>

Figure 2:
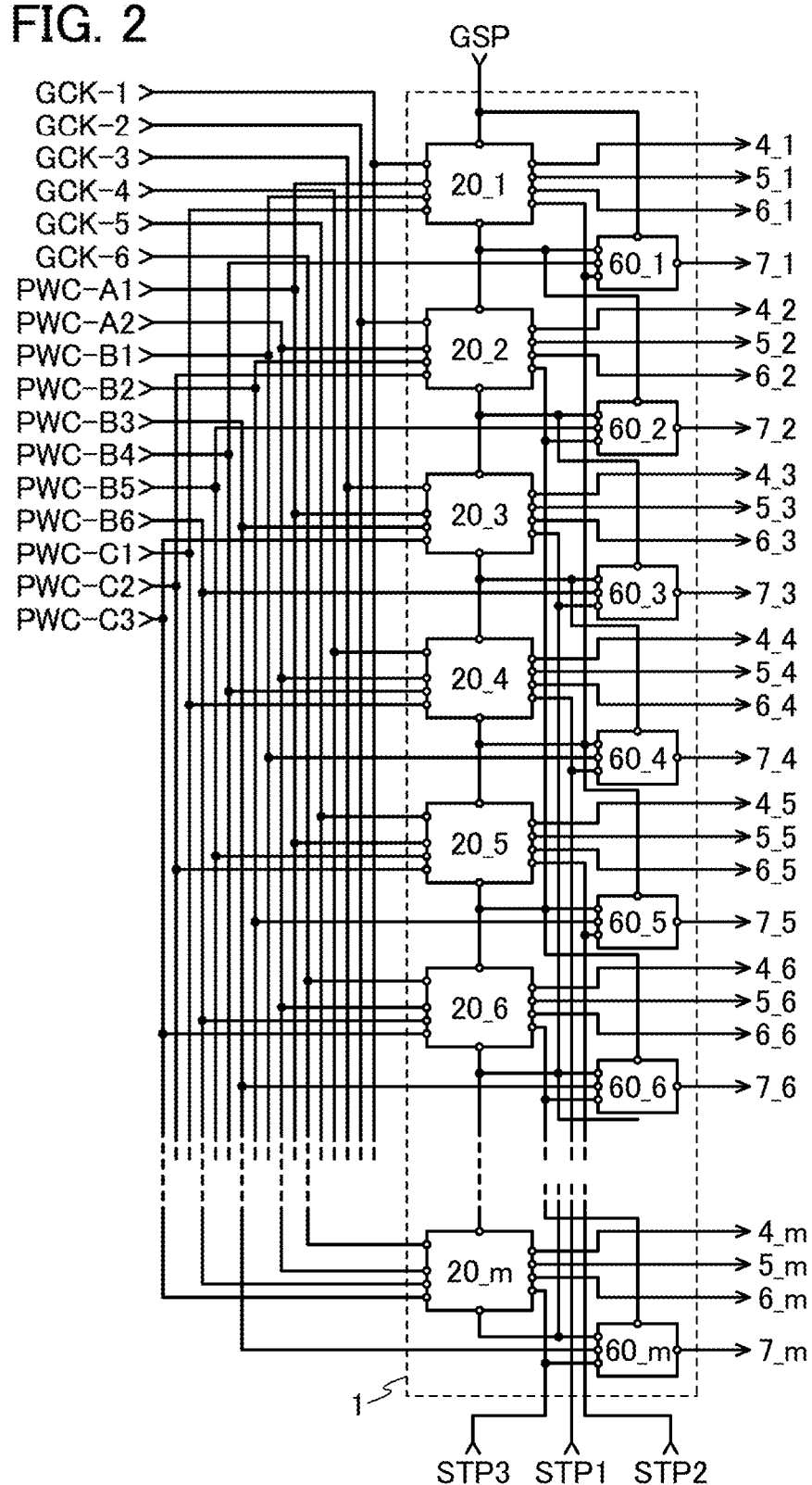
FIG. 2 illustrates a configuration example of a scan line driver circuit.

FIG. 2 illustrates a configuration example of the scan line driver circuit 1 included in the display device in FIG. 1. The scan line driver circuit 1 in FIG. 2 includes wirings that respectively supply first to sixth clock signals (GCK-1 to GCK-6) for the scan line driver circuit (hereinafter "the first clock signal (GCK-1)" to "the sixth clock signal GCK-6"), wirings that respectively supply first and second pulse width control signals A (PWC-A1 and PWC-A2), wirings that respectively supply first to sixth pulse width control signals B (PWC-B1 to PWC-B6), wirings that respectively supply first to third pulse width control signals C (PWC-C1 to PWC-C3), first to m-th pulse output circuits 20_1 to 20_m that are electrically connected to the first to m-th rows of m·n pixels 10 through scan lines 4_1 to 4_m, scan lines 5_1 to 5_m, and scan lines 6_1 to 6_m, first to m-th inverted pulse output circuits 60_1 to 60_m that are electrically connected to the first to m-th rows of m·n pixels 10 through reverse scan lines 7_1 to 7_m.

The first to m-th pulse output circuits 20_1 to 20_m are configured to sequentially shift a shift pulse by a scan line driver circuit start pulse GSP which is input to the first pulse output circuit 20_1. Specifically, after the scan line driver circuit start pulse (GSP) is input to the first pulse output circuit 20_1, the first pulse output circuit 20_1 outputs a shift pulse to the second pulse output circuit 20_2. Next, after the shift pulse output from the first pulse output circuit 20_1 is input to the second pulse output circuit 20_2, the second pulse output circuit 20_2 outputs a shift pulse to the third pulse output circuit 20_3. After that, operations similar to the above operations are repeated until a shift pulse is input to the m-th pulse output circuit 20_m.

The first to m-th pulse output circuits 20__1 to 20__m are configured to output selection signals to respective scan lines 4__1 to 4_m, respective scan lines 5__1 to 5_m, and respective scan lines 6__1 to 6_m, when the scan line driver circuit start pulse (GSP) or a shift pulse is input. Note that the selection signals refer to signals for turning on switches whose switching are controlled by potentials of respective scan lines 4__1 to 4_m, respective scan lines 5__1 to 5_m, and respective scan lines 6__1 to 6_m.

Figure 3:
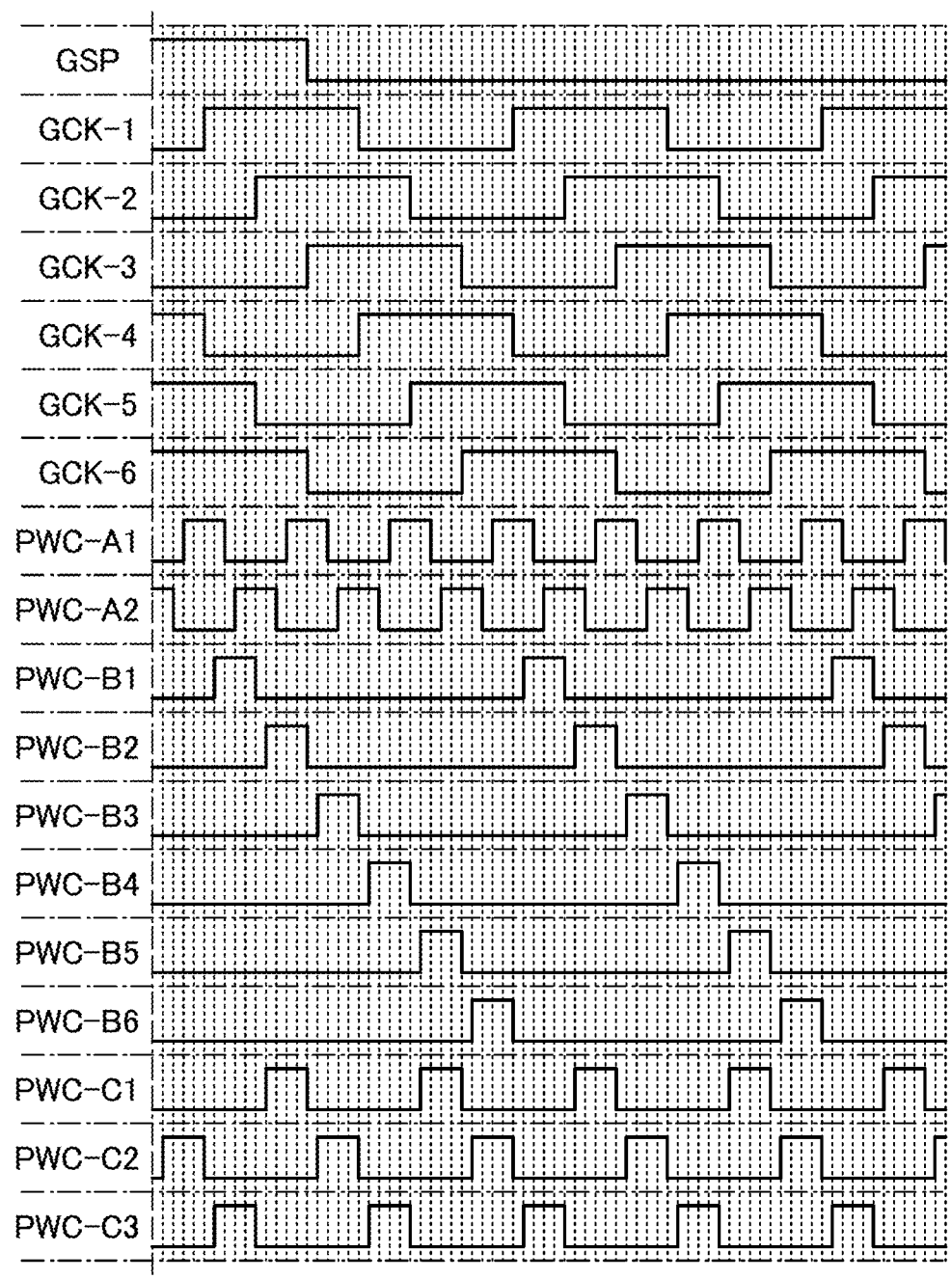
FIG. 3 shows an example of waveforms of a variety of signals.

FIG. 3 shows a specific example of waveforms of the above signals.

The first clock signal (GCK-1) in FIG. 3 periodically alternates between a high-level potential (high power supply potential (Vdd)) and a low-level potential (low power supply potential (Vss)) and has a duty ratio of ½. The second clock signal (GCK-2) has a phase shifted by ⅙ period from the first clock signal (GCK-1); the third clock signal (GCK-3) has a phase shifted by ⅓ period from the first clock signal (GCK-1); the fourth clock signal (GCK-4) has a phase shifted by ½ period from the first clock signal (GCK-1); the fifth clock signal (GCK-5) has a phase shifted by ⅔ period from the first clock signal (GCK-1); and the sixth clock signal (GCK-6) has a phase shifted by ⅚ period from the first clock signal (GCK-1).

The first pulse width control signal A (PWC-A1) in FIG. 3 periodically alternates between the high-level potential (high power supply potential (Vdd)) and the low-level potential (low power supply potential (Vss)) and has a duty ratio of ⅖. The second pulse width control signal A (PWC-A2) has a phase shifted by ½ period from the first pulse width control signal A (PWC-A1).

The first pulse width control signal B (PWC-B1) in FIG. 3 periodically alternates between the high-level potential (high power supply potential (Vdd)) and the low-level potential (low power supply potential (Vss)) and has a duty ratio of 2/15. The second pulse width control signal B (PWC-B2) is a signal whose phase is shifted by ⅙ period from the first pulse width control signal B (PWC-B1); the third pulse width control signal B (PWC-B3) is a signal whose phase is shifted by ⅓ period from the first pulse width control signal B (PWC-B1); the fourth pulse width control signal B (PWC-B4) is a signal whose phase is shifted by ½ period from the first pulse width control signal B (PWC-B1); the fifth pulse width control signal B (PWC-B5) is a signal whose phase is shifted by ⅔ period from the first pulse width control signal B (PWC-B1); and the sixth pulse width control signal B (PWC-B6) is a signal whose phase is shifted by ⅚ period from the first pulse width control signal B (PWC-B1).

The first pulse width control signal C (PWC-C1) in FIG. 3 periodically alternates between the high-level potential (high power supply potential (Vdd)) and the low-level potential (low power supply potential (Vss)) and has a duty ratio of 4/15. The first pulse width control signal C (PWC-C1) can also be expressed as a signal which is at the high-level potential in a period when the second pulse width control signal B (PWC-B2) is at the high-level potential and in a period when the fifth pulse width control signal B (PWC-B5) is at the high-level potential. The second pulse width control signal C (PWC-C2) is a signal whose phase is shifted by ⅓ period from the first pulse width control signal C (PWC-C1); and the third pulse width control signal C (PWC-C3) is a signal whose phase is shifted by ⅔ period from the first pulse width control signal C (PWC-C1).

In the display device in FIG. 2, the same configuration can be applied to the first to m-th pulse output circuits 20__1 to 20_m. Note that the electrical connections of a plurality of terminals of the pulse output circuit differ among the pulse output circuits. Specific connections will be described with reference to FIG. 2 and FIG. 4A.

Each of the first to m-th pulse output circuits 20__1 to 20_m has terminals 21 to 30. The terminals 21 to 25 and 29 are input terminals, and the terminals 26 to 28 and 30 are output terminals.

First, the terminal 21 will be described. The terminal 21 of the first pulse output circuit 20__1 is electrically connected to a wiring that supplies the scan line driver circuit start pulse (GSP). The terminals 21 of the second to m-th pulse output circuit 20__2 to 20_m are electrically connected to the respective terminals 30 of the respective previous-stage pulse output circuits.

The terminal 22 will be described. The terminal 22 of the (6a−5)-th pulse output circuit 20__6a−5 (a is a natural number less than or equal to m/6) is electrically connected to the wiring that supplies the first clock signal (GCK-1). The terminal 22 of the (6a−4)-th pulse output circuit 20__6a−4 is electrically connected to the wiring that supplies the second clock signal (GCK-2). The terminal 22 of the (6a−3)-th pulse output circuit 20__6a−3 is electrically connected to the wiring that supplies the third clock signal (GCK-3). The terminal 22 of the (6a−2)-th pulse output circuit 20__6a−2 is electrically connected to the wiring that supplies the fourth clock signal (GCK-4). The terminal 22 of the (6a−1)-th pulse output circuit 20__6a−1 is electrically connected to the wiring that supplies the fifth clock signal (GCK-5). The terminal 22 of the 6a-th pulse output circuit 20__6a is electrically connected to the wiring that supplies the sixth clock signal (GCK-6).

The terminal 23 will be described. The terminal 23 of the (6a−5)-th pulse output circuit 20__6a−5, the terminal 23 of the (6a−3)-th pulse output circuit 20__6a−3, and the terminal 23 of the (6a−1)-th pulse output circuit 20__6a−1 are electrically connected to the wiring that supplies the first pulse width control signal A (PWC-A1). The terminal 23 of the (6a−4)-th pulse output circuit 20__6a−4, the terminal 23 of the (6a−2)-th pulse output circuit 20__6a−2, and the terminal 23 of the 6a-th pulse output circuit 20__6a are electrically connected to the wiring that supplies the second pulse width control signal A (PWC-A2).

The terminal 24 will be described. The terminal 24 of the (6a−5)-th pulse output circuit 20__6a−5 is electrically connected to the wiring that supplies the first pulse width control signal B (PWC-B1). The terminal 24 of the (6a−4)-th pulse output circuit 20__6a−4 is electrically connected to the wiring that supplies the second pulse width control signal B (PWC-B2). The terminal 24 of the (6a−3)-th pulse output circuit 20__6a−3 is electrically connected to the wiring that supplies the third pulse width control signal B (PWC-B3). The terminal 24 of the (6a−2)-th pulse output circuit 20__6a−2 is electrically connected to the wiring that supplies the fourth pulse width control signal B (PWC-B4). The terminal 24 of the (6a−1)-th pulse output circuit 20__6a−1 is electrically connected to the wiring that supplies the fifth pulse width control signal B (PWC-B5). The terminal 24 of the 6a-th pulse output circuit 20__6a is electrically connected to the wiring that supplies the sixth pulse width control signal B (PWC-B6).

The terminal 25 will be described. The terminal 25 of the (6a−5)-th pulse output circuit 20__6a−5 and the terminal 25 of the (6a−2)-th pulse output circuit 20__6a−2 are electrically connected to the wiring that supplies the first pulse width control signal C (PWC-C1). The terminal 25 of the (6a−4)-th pulse output circuit 20__6a−4 and the terminal 25 of the (6a−1)-th pulse output circuit 20__6a−1 are electrically connected to the wiring that supplies the second pulse width control signal C (PWC-C2). The terminal 25 of the (6a−3)-th pulse output circuit 20__6a−3 and the terminal 25 of the 6a-th pulse output circuit 20__6a are electrically connected to the wiring that supplies the third pulse width control signal C (PWC-C3).

The terminal 26 will be described. The terminal 26 of the x-th pulse output circuit 20_x (x is a natural number less than or equal to m) is electrically connected to the scan line 4_x in the x-th row.

The terminal 27 will be described. The terminal 27 of the x-th pulse output circuit 20_x is electrically connected to the scan line 5_x in the x-th row.

The terminal 28 will be described. The terminal 28 of the x-th pulse output circuit 20_x is electrically connected to the scan line 6_x in the x-th row.

The terminal 29 will be described. The terminal 29 of the y-th pulse output circuit 20_y (y is a natural number less than or equal to (m−3)) is electrically connected to the terminal 30 of the (y+3)-th pulse output circuit 20_y+3. The terminal 29 of the (m−2)-th pulse output circuit 20_m−2 is electrically connected to a wiring that supplies a stop signal (STP1) for the (m−2)-th pulse output circuit. The terminal 29 of the (m−1)-th pulse output circuit 20_m−1 is electrically connected to a wiring that supplies a stop signal (STP2) for the (m−1)-th pulse output circuit. The terminal 29 of the m-th pulse output circuit 20_m is electrically connected to a wiring that supplies a stop signal (STP3) for the m-th pulse output circuit. In the case where a (m+1)-th pulse output circuit is provided, the stop signal (STP1) for the (m−2)-th pulse output circuit corresponds to a signal output from the terminal 30 of the (m+1)-th pulse output circuit. In the case where a (m+2)-th pulse output circuit is provided, the stop signal (STP2) for the (m−1)-th pulse output circuit corresponds to a signal output from the terminal 30 of the (m+2)-th pulse output circuit. In the case where a (m+3)-th pulse output circuit is provided, the stop signal (STP3) for the m-th pulse output circuit corresponds to a signal output from the terminal 30 of the (m+3)-th pulse output circuit. Specifically, for example, the (m+1)-th to (m+3)-th pulse output circuits may be actually provided as dummy circuits, or the signal may be directly input from an external portion.

The connection of the terminal 30 of each pulse output circuit is described above. Thus, for the description thereof, refer to the above description.

In the display device in FIG. 2, the same configuration can be applied to the first to m-th inverted pulse output circuits 60__1 to 60__m. However, the electrical connections of a plurality of terminals of the inverted pulse output circuit differ among the inverted pulse output circuits. Specific connections will be described with reference to FIG. 2 and FIG. 4B.

Each of the first to m-th inverted pulse output circuits 60__1 to 60__m has terminals 61 to 65. The terminals 61 to 64 are input terminals, and the terminal 65 is an output terminal.

First, the terminal 61 will be described. The terminal 61 of the first inverted pulse output circuit 60__1 is electrically connected to a wiring that supplies the scan line driver circuit start pulse (GSP). The terminals 61 of the second to m-th inverted pulse output circuits 60__2 to 60__m are electrically connected to the respective terminals 30 of the respective previous-stage inverted pulse output circuits.

The terminal 62 will be described. The terminal 62 of the x-th inverted pulse output circuit 60_x is electrically connected to the terminal 30 of the x-th pulse output circuit 20_x.

The terminal 63 will be described. The terminal 63 of the (6a−5)-th inverted pulse output circuit 60__6a−5 is electrically connected to the wiring that supplies the fourth pulse width control signal B (PWC-B4). The terminal 63 of the (6a−4)-th inverted pulse output circuit 60__6a−4 is electrically connected to the wiring that supplies the fifth pulse width control signal B (PWC-B5). The terminal 63 of the (6a−3)-th inverted pulse output circuit 60__6a−3 is electrically connected to the wiring that supplies the sixth pulse width control signal B (PWC-B6). The terminal 63 of the (6a−2)-th inverted pulse output circuit 60__6a−2 is electrically connected to the wiring that supplies the first pulse width control signal B (PWC-B1). The terminal 63 of the (6a−1)-th inverted pulse output circuit 60__6a−1 is electrically connected to the wiring that supplies the second pulse width control signal B (PWC-B2). The terminal 63 of the 6a-th inverted pulse output circuit 60__6a is electrically connected to the wiring that supplies the third pulse width control signal B (PWC-B3).

The terminal 64 will be described. The terminal 64 of the y-th inverted pulse output circuit 60_y is electrically connected to the terminal 30 of the (y+3)-th pulse output circuit 20_y+3. The terminal 64 of the (m−2)-th inverted pulse output circuit 60_m−2 is electrically connected to a wiring that supplies a stop signal (STP1) for the (m−2)-th pulse output circuit. The terminal 64 of the (m−1)-th inverted pulse output circuit 60_m−1 is electrically connected to a wiring that supplies a stop signal (STP2) for the (m−1)-th pulse output circuit. The terminal 64 of the m-th inverted pulse output circuit 60_m is electrically connected to a wiring that supplies a stop signal (STP3) for the m-th pulse output circuit.

The terminal 65 will be described. The terminal 65 of the x-th inverted pulse output circuit 60_x is electrically connected to the inverted scan line 7_x in the x-th row.

<Configuration Example of Pulse Output Circuit>

Figure 4A:
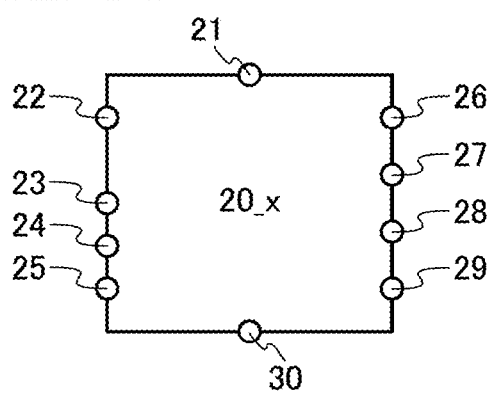
FIG. 4A illustrates terminals of a pulse output circuit.
Figure 5A:
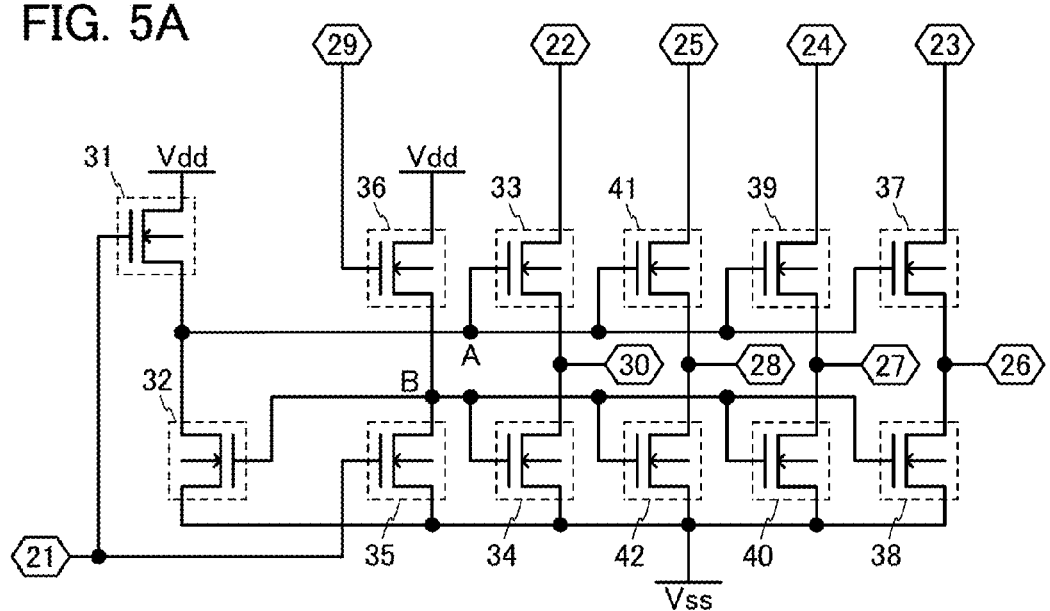
FIG. 5A illustrates a configuration example of a pulse output circuit.

FIG. 5A illustrates a configuration example of the pulse output circuit illustrated in FIG. 2 and FIG. 4A. The pulse output circuit illustrated in FIG. 5A includes transistors 31 to 42.

One of a source and a drain of the transistor 31 is electrically connected to a wiring that supplies the high power supply potential (Vdd) (hereinafter also referred to as a high power supply potential line); and a gate of the transistor 31 is electrically connected to the terminal 21.

One of a source and a drain of the transistor 32 is electrically connected to a wiring that supplies the low power supply potential (Vss) (hereinafter also referred to as a low power supply potential line); and the other of the source and the drain of the transistor 32 is electrically connected to the other of the source and the drain of the transistor 31.

One of a source and a drain of the transistor 33 is electrically connected to the terminal 22; the other of the source and the drain of the transistor 33 is electrically connected to the terminal 30; and a gate of the transistor 33 is electrically connected to the other of the source and the drain of the transistor 31 and the other of the source and the drain of the transistor 32.

One of a source and a drain of the transistor 34 is electrically connected to the low power supply potential line; the other of the source and the drain of the transistor 34 is electrically connected to the terminal 30; and a gate of the transistor 34 is electrically connected to a gate of the transistor 32.

One of a source and a drain of the transistor 35 is electrically connected to the low power supply potential line; the other of the source and the drain of the transistor 35 is electrically connected to the gate of the transistor 32 and the gate of the transistor 34; and a gate of the transistor 35 is electrically connected to the terminal 21.

One of a source and a drain of the transistor 36 is electrically connected to the high power supply potential line; the other of the source and the drain of the transistor 36 is electrically connected to the gate of the transistor 32, the gate of the transistor 34, and the other of the source and the drain of the transistor 35; and a gate of the transistor 36 is electrically connected to the terminal 29.

One of a source and a drain of the transistor 37 is electrically connected to the terminal 23; the other of the source and the drain of the transistor 37 is electrically connected to the terminal 26; and a gate of the transistor 37 is electrically connected to the other of the source and the drain of the transistor 31, the other of the source and the drain of the transistor 32, and the gate of the transistor 33.

One of a source and a drain of the transistor 38 is electrically connected to the low power supply potential line; the other of the source and the drain of the transistor 38 is electrically connected to the terminal 26; and a gate of the transistor 38 is electrically connected to the gate of the transistor 32, the gate of the transistor 34, the other of the source and the drain of the transistor 35, and the other of the source and the drain of the transistor 36.

One of a source and a drain of the transistor 39 is electrically connected to the terminal 24; the other of the source and the drain of the transistor 39 is electrically connected to the terminal 27; and a gate of the transistor 39 is electrically connected to the other of the source and the drain of the transistor 31, the other of the source and the drain of the transistor 32, the gate of the transistor 33, and the gate of the transistor 37.

One of a source and a drain of the transistor 40 is electrically connected to the low power supply potential line; the other of the source and the drain of the transistor 40 is electrically connected to the terminal 27; and a gate of the transistor 40 is electrically connected to the gate of the transistor 32, the gate of the transistor 34, the other of the source and the drain of the transistor 35, the other of the source and the drain of the transistor 36, and the gate of the transistor 38.

One of a source and a drain of the transistor 41 is electrically connected to the terminal 25; the other of the source and the drain of the transistor 41 is electrically connected to the terminal 28; and a gate of the transistor 41 is electrically connected to the other of the source and the drain of the transistor 31, the other of the source and the drain of the transistor 32, the gate of the transistor 33, the gate of the transistor 37, and the gate of the transistor 39.

One of a source and a drain of the transistor 42 is electrically connected to the low power supply potential line; the other of the source and the drain of the transistor 42 is electrically connected to the terminal 28; and a gate of the transistor 42 is electrically connected to the gate of the transistor 32, the gate of the transistor 34, the other of the source and the drain of the transistor 35, the other of the source and the drain of the transistor 36, the gate of the transistor 38, and the gate of the transistor 40.

Note that in the following description, a node where the other of the source and the drain of the transistor 31, the other of the source and the drain of the transistor 32, the gate of the transistor 33, the gate of the transistor 37, the gate of the transistor 39, and the gate of the transistor 41 are electrically connected is referred to as a node A. A node where the gate of the transistor 32, the gate of the transistor 34, the other of the source and the drain of the transistor 35, the other of the source and the drain of the transistor 36, the gate of the transistor 38, the gate of the transistor 40, and the gate of the transistor 42 are electrically connected is referred to as a node B.

<Operation Example of Pulse Output Circuit>

Figure 5B:
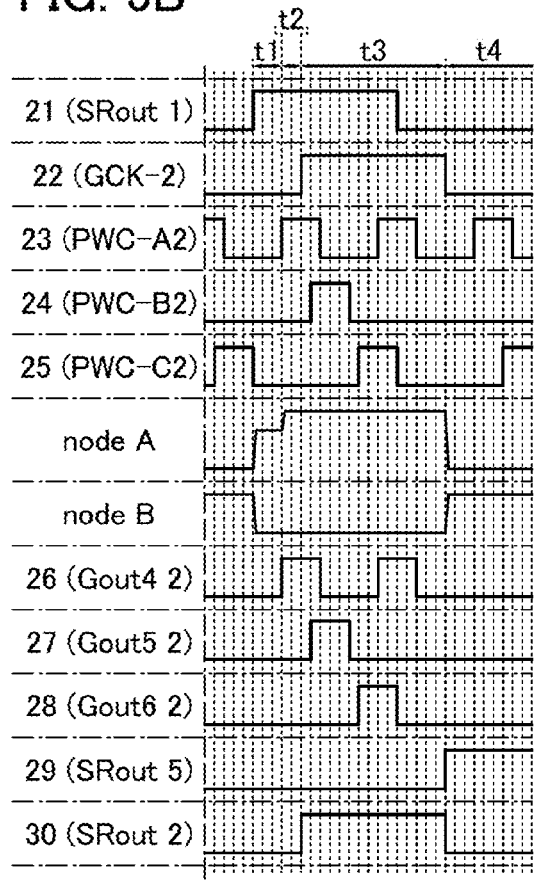
FIG. 5B shows an operation example thereof.

An operation example of the above pulse output circuit will be described with reference to FIG. 5B. FIG. 5B shows signals input to the respective terminals of the second pulse output circuit 20_2 at the time when a shift pulse is input from the first pulse output circuit 20_1, potentials of the signals output from the respective terminals, and potentials of the nodes A and B. Note that in FIG. 5B, Gout4 represents a signal output from any of the pulse output circuits to the corresponding scan line 4, Gout5 represents a signal output from any of the pulse output circuits to the corresponding scan line 5, Gout6 represents a signal output from any of the pulse output circuits to the corresponding scan line 6, and SRout represents a signal output from any of the pulse output circuits to the next-stage pulse output circuit.

First, the case where a shift pulse is input from the first pulse output circuit 20_1 to the second pulse output circuit 20_2 will be described with reference to FIG. 5B.

In a period t1, the high-level potential (high power supply potential (Vdd)) is input to the terminal 21. Accordingly, the transistors 31 and 35 are turned on, so that the potential of the node A is raised to a high-level potential (a potential lower than the high power supply potential (Vdd) by the threshold voltage of the transistor 31), and the potential of the node B is lowered to the low power supply potential (Vss). Accordingly, the transistors 33, 37, 39, and 41 are turned on, and the transistors 32, 34, 38, 40 and 42 are turned off. Thus, in the period t1, a signal output from the terminal 26 is input to the terminal 23, a signal output from the terminal 27 is input to the terminal 24, a signal output from the terminal 28 is input to the terminal 25, and a signal output from the terminal 30 is input to the terminal 22. Here, in the period t1, the signals input to the terminals 22 to 25 are at the low-level potential (low power supply potential (Vss)). Thus, in the period t1, the second pulse output circuit 20_2 outputs the low-level potential (low power supply potential (Vss)) to the terminal 21 of the third pulse output circuit 20_3 and the scan lines 4_2, 5_2, and 6_2 in the second row in a pixel portion.

In a period t2, the high-level potential (high power supply potential (Vdd)) is input to the terminal 23. Note that the potential of the node A (the potential of the source of the transistor 31) is raised to a high-level potential (the potential lower than the high power supply potential (Vdd)) by the threshold voltage of the transistor 31) in the period t1. Thus, the transistor 31 is off. At this time, the input of the high-level potential (high power supply potential (Vdd)) to the terminal 23 further raises the potential of the node A (a potential of the gate of the transistor 37) owing to the capacitive coupling between the gate and the source of the transistor 37 (bootstrapping). Owing to the bootstrapping, the potential of the signal output from the terminal 26 is not lower than the high-level potential (high power supply potential (Vdd)) input to the terminal 23 (a signal which is the same or substantially the same as the signal input to the terminal 23 is output from the terminal 26). Accordingly, in the period t2, the second pulse output circuit 20_2 outputs the high-level potential (high power supply potential (Vdd)=a selection signal) to the scan line 4_2 in the second row in the pixel portion. In addition, the second pulse output circuit 20_2 outputs the low-level potential (low power supply potential (Vss)) to the terminal 21 of the third pulse output circuit 20_3 and the scan lines 5_2 and 6_2 in the second row in the pixel portion.

In a period t3, the high-level potential (high power supply potential (Vdd)) is input to at least the terminal 22. Thus, the potential of the node A remains higher than that in the period t1 as in the period t2. Accordingly, a signal which is the same or substantially the same as the signal input to the terminal 23 is output from the terminal 26; a signal which is the same or substantially the same as the signal input to the terminal 24 is output from the terminal 27; a signal which is the same or substantially the same as the signal input to the terminal 25 is output from the terminal 28; and a signal which is the same or substantially the same as the signal input to the terminal 22 is output from the terminal 30. That is to say, in the period t3, the second pulse output circuit 20\_2 outputs a signal which is the same or substantially the same as the signal input to the terminal 22 to the terminal 21 of the third pulse output circuit 20\_3, a signal which is the same or substantially the same as the signal input to the terminal 23 to the scan line 4\_2, a signal which is the same or substantially the same as the signal input to the terminal 24 to the scan line 5\_2, and a signal which is the same or substantially the same as the signal input to the terminal 25 to the scan line 6\_2.

In a period t4, the high-level potential (high power supply potential (Vdd)) is input to the terminal 29. Accordingly, the transistor 36 is turned on, so that the potential of the node B is raised to a high-level potential (a potential lower than the high power supply potential (Vdd) by the threshold voltage of the transistor 36). That is, the transistors 32, 34, 38, 40, 42 are turned on. Accordingly, the potential of the node A is lowered to the low-level potential (low power supply potential (Vss)), so that the transistors 33, 37, 39, and 41 are turned off. Thus, in the period t4, all the signals output from the terminals 26, 27, 28, and 30 are at the low power supply potential (Vss). In other words, in the period t4, the second pulse output circuit 20\_2 outputs the low power supply potential (Vss) to the terminal 21 of the third pulse output circuit 20\_3, and the scan lines 4\_2, 5\_2, and 6\_2 in the second row in the pixel portion.

<Configuration Example of Inverted Pulse Output Circuit>

Figure 4B:
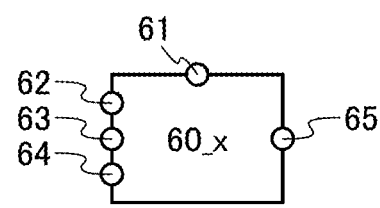
FIG. 4B illustrates terminals of an inverted pulse output circuit.
Figure 6A:
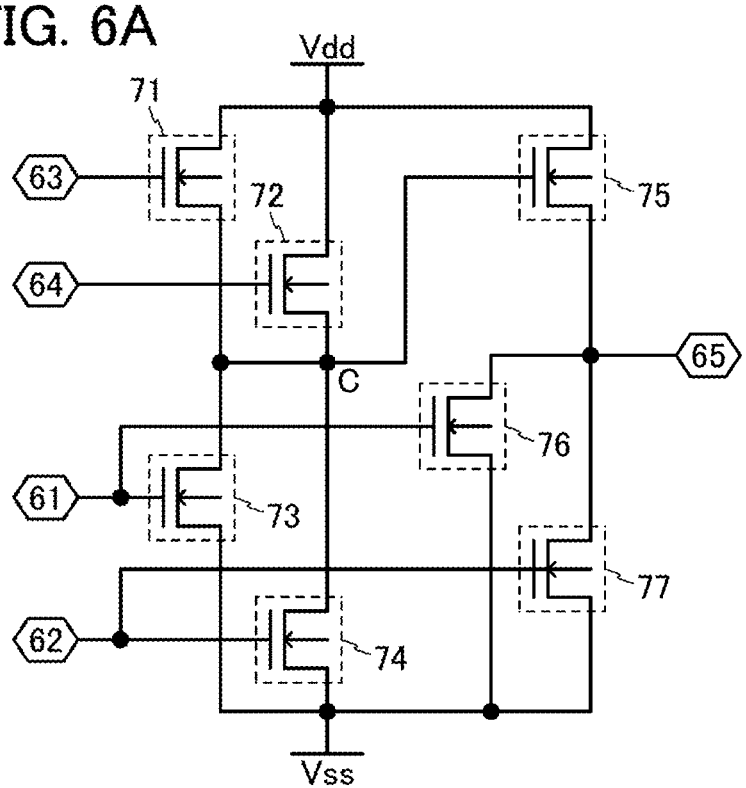
FIG. 6A illustrates a configuration example of an inverted pulse output circuit.

FIG. 6A illustrates a configuration example of the inverted pulse output circuit illustrated in FIG. 2 and FIG. 4B. The inverted pulse output circuit in FIG. 6A includes transistors 71 to 77.

One of a source and a drain of the transistor 71 is electrically connected to the high power supply potential line; and a gate of the transistor 71 is electrically connected to the terminal 63.

One of a source and a drain of the transistor 72 is electrically connected to the high power supply potential line; the other of the source and the drain of the transistor 72 is electrically connected to the other of the source and the drain of the transistor 71; and a gate of the transistor 72 is electrically connected to the terminal 64.

One of a source and a drain of the transistor 73 is electrically connected to the low power supply potential line; the other of the source and the drain of the transistor 73 is electrically connected to the other of the source and the drain of the transistor 71 and the other of the source and the drain of the transistor 72; and a gate of the transistor 73 is electrically connected to the terminal 61.

One of a source and a drain of the transistor 74 is electrically connected to the low power supply potential line; the other of the source and the drain of the transistor 74 is electrically connected to the other of the source and the drain of the transistor 71, the other of the source and the drain of the transistor 72, and the other of the source and the drain of the transistor 73; and a gate of the transistor 74 is electrically connected to the terminal 62.

One of a source and a drain of the transistor 75 is electrically connected to the high power supply potential line; the other of the source and the drain of the transistor 75 is electrically connected to the terminal 65; and a gate of the transistor 75 is electrically connected to the other of the source and the drain of the transistor 71, the other of the source and the drain of the transistor 72, the other of the source and the drain of the transistor 73, and the other of the source and the drain of the transistor 74.

One of a source and a drain of the transistor 76 is electrically connected to the low power supply potential line; the other of the source and the drain of the transistor 76 is electrically connected to the terminal 65; and a gate of the transistor 76 is electrically connected to the terminal 61.

One of a source and a drain of the transistor 77 is electrically connected to the low power supply potential line; the other of the source and the drain of the transistor 77 is electrically connected to the terminal 65; and a gate of the transistor 77 is electrically connected to the terminal 62.

Note that in the following description, a node where the other of the source and the drain of the transistor 71, the other of the source and the drain of the transistor 72, the other of the source and the drain of the transistor 73, the other of the source and the drain of the transistor 74, and the gate of the transistor 75 are electrically connected is referred to as a node C.

<Operation Example of Inverted Pulse Output Circuit>

Figure 6B:
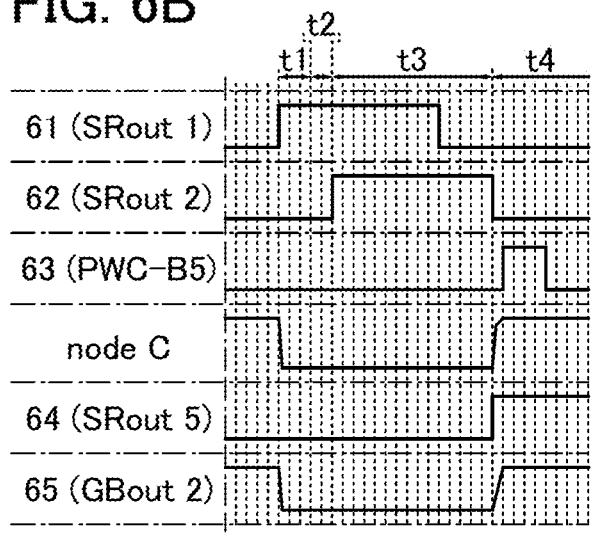
FIG. 6B shows an operation example thereof.

An operation example of the inverted pulse output circuit will be described with reference to FIG. 6B. FIG. 6B illustrates signals input to the respective terminals of the second inverted pulse output circuit 20\_2, potentials of signals output therefrom, and potentials of the node C in periods t1 to t4 in FIG. 6B. The periods t1 to t4 in FIG. 6B correspond to the periods t1 to t4 in FIG. 5B. Note that in FIG. 6B, the signals input to the terminals are provided in parentheses. Further, in FIG. 6B, GBout represents a signal output from any of the inverted pulse output circuits to the corresponding inverted scan line.

In the periods t1 to t3, the high-level potential (high power supply potential (Vdd)) is input to at least one of the terminal 61 and the terminal 62. Accordingly, the transistors 73, 74, 76, and 77 are turned on, so that the potential of the node C is lowered to the low-level potential (low power supply potential (Vss)). Thus, the transistor 75 is turned off. Accordingly, in the periods t1 to t3, the signal output from the terminal 65 is at the low-level potential (low power supply potential (Vss)), so that in the periods t1 to t3, the second inverted pulse output circuit 60\_2 outputs the low-level potential (low power supply potential (Vss)) to the inverted scan line 7\_2 in the second row in the pixel portion.

In the period t4, the low-level potential (low power supply potential (Vss)) is input to the terminal 61 and the terminal 62, and the high-level potential (high power supply potential (Vdd)) is input to the terminal 64. Accordingly, the transistors 73, 74, 76, and 77 are turned off, and the transistor 72 is turned on, so that the potential of the node C is raised to a high-level potential (a potential lower than the high power supply potential (Vdd) by the threshold voltage of the transistor 72), and the transistor 75 is turned on. Note that the transistor 72 is turned off when the potential of the node C is raised to the potential lower than the high power supply potential (Vdd) by the threshold voltage of the transistor 72. When the transistor 72 is turned off, the transistor 75 remains on. In this case, the potential of the node C is further raised even after the transistor 72 is turned off, owing to the capacitive coupling between the gate (node C) and the source of the transistor 75. Thus, the signal output from the terminal 65 is not lower than the high power supply potential (Vdd). Accordingly, in the period t4, the signal output from the terminal 65 is at the high power supply potential (Vdd). That is, in the period t4, the second inverted pulse output circuit 60\_2 outputs the high power supply potential (Vdd) to the inverted scan line 7\_2 in the second row in the pixel portion.

<Configuration Example of Pixel>

Figure 7A:
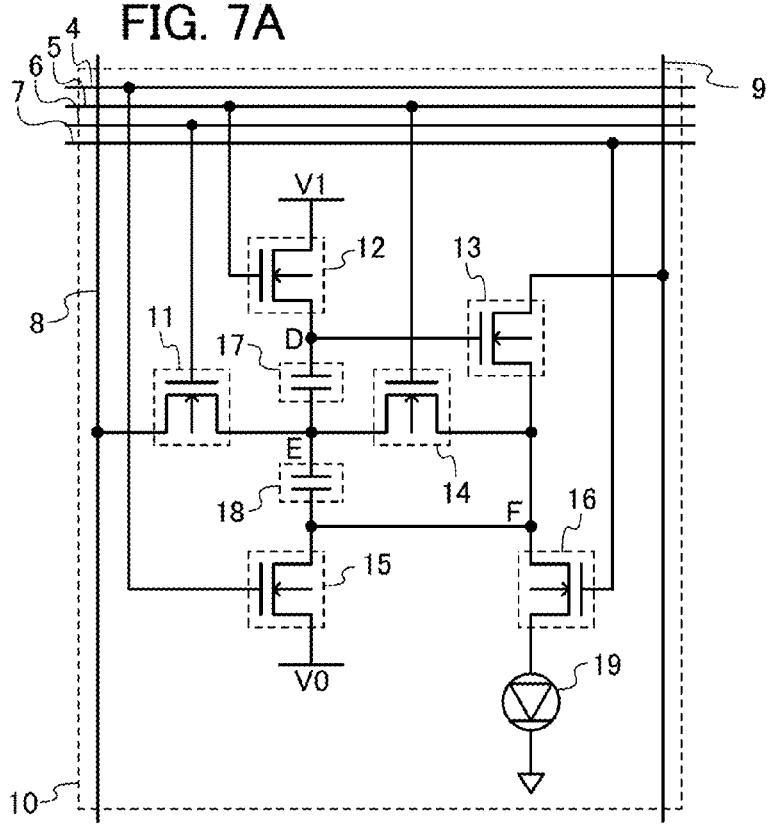
FIG. 7A illustrates a configuration example of a pixel.

FIG. 7A is a circuit diagram illustrating a configuration example of the pixel 10 in FIG. 1. The pixel 10 in FIG. 7A includes transistors 11 to 16, capacitors 17 and 18, and an element 19 including an organic material that emits light owing to current excitation between a pair of electrodes (hereinafter also referred to as organic electroluminescent (EL) element).

One of a source and a drain of the transistor 11 is electrically connected to the signal line 8; and a gate of the transistor 11 is electrically connected to the scan line 6.

One of a source and a drain of the transistor 12 is electrically connected to a wiring that supplies a potential V1; and a gate of the transistor 12 is electrically connected to the scan line 5. Here, assume that the potential V1 is lower than the high power supply potential (Vdd) and higher than the low power supply potential (Vss).

One of a source and a drain of the transistor 13 is electrically connected to the power supply line 9; and a gate of the transistor 13 is electrically connected to the other of the source and the drain of the transistor 12.

One of a source and a drain of the transistor 14 is electrically connected to the other of the source and the drain of the transistor 11; the other of the source and the drain of the transistor 14 is electrically connected to the other of the source and the drain of the transistor 13; and a gate of the transistor 14 is electrically connected to the scan line 5.

One of a source and a drain of the transistor 15 is electrically connected to a wiring that supplies a potential V0; the other of the source and the drain of the transistor 15 is electrically connected to the other of the source and the drain of the transistor 13 and the other of the source and the drain of the transistor 14; and a gate of the transistor 15 is electrically connected to the scan line 4. Here, assume that the potential V0 is lower than the potential V1 and higher than the low power supply potential (Vss).

One of a source and a drain of the transistor 16 is electrically connected to the other of the source and the drain of the transistor 13, the other of the source and the drain of the transistor 14, and the other of the source and the drain of the transistor 15; and a gate of the transistor 16 is electrically connected to the inverted scan line 7.

One electrode of the capacitor 17 is electrically connected to the other of the source and the drain of the transistor 12 and the gate of the transistor 13; and the other electrode of the capacitor 17 is electrically connected to the other of the source and the drain of the transistor 11 and the other of the source and the drain of the transistor 14.

One electrode of the capacitor 18 is electrically connected to the other of the source and the drain of the transistor 11, one of the source and the drain of the transistor 14 and the other electrode of the capacitor 17; and the other electrode of the capacitor 18 is electrically connected to the other of the source and the drain of the transistor 13, the other of the source and the drain of the transistor 14, the other of the source and the drain of the transistor 15, and the one of the source and the drain of the transistor 16.

An anode of the organic EL element 19 is electrically connected to the other of the source and the drain of the transistor 16; a cathode of the organic EL element 19 is electrically connected to a wiring that supplies a common potential. Note that the common potential given to the wiring electrically connected to the one of the source and the drain of the transistor 12 may be different from the common potential given to the cathode of the organic EL element 19.

Here, assume that the potential supplied by the power supply line 9 is lower than the high power supply potential (Vdd) and higher than the potential V1, and the common potential is lower than the low power supply potential (Vss).

Hereinafter, a node where the other of the source and the drain of the transistor 12, the gate of the transistor 13, and the one electrode of the capacitor 17 are electrically connected is referred to as a node D. A node where the other of the source and the drain of the transistor 11, the one of the source and the drain of the transistor 14, the other electrode of the capacitor 17, and the one electrode of the capacitor 18 are electrically connected is referred to as a node E. A node where the other of the source and the drain of the transistor 13, the other of the source and the drain of the transistor 14, the other of the source and the drain of the transistor 15, the one of the source and the drain of the transistor 16, and the other electrode of the capacitor 18 are electrically connected is referred to as a node F.

<Operation Example of Pixel>

Figure 7B:
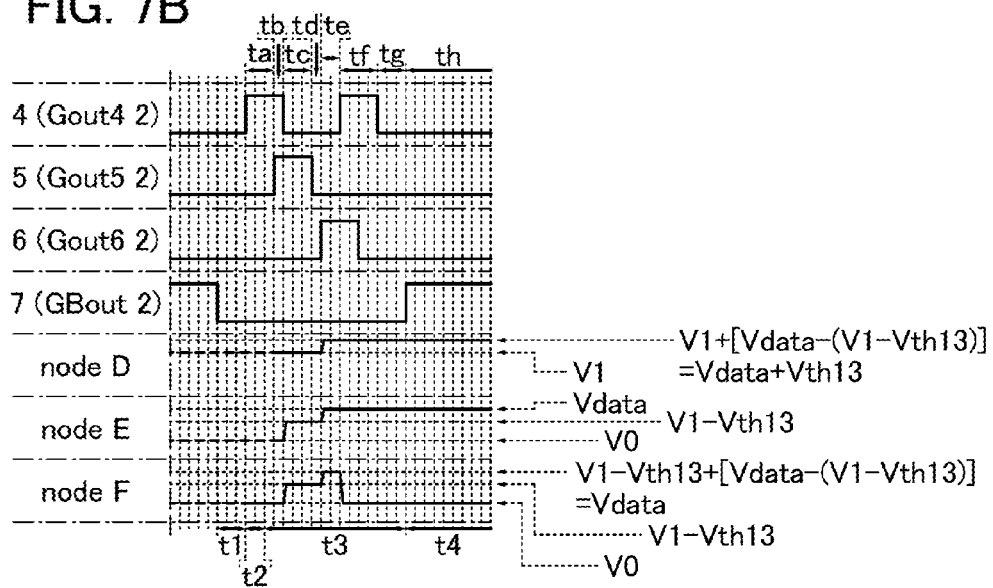
FIG. 7B shows an operation example thereof.

An operation example of the above pixel will be described with reference to FIGS. 7A and 7B. Specifically, an operation example of the pixel in periods ta to th included in the periods t1 to t4 in FIG. 5B and FIG. 6B will be described below with reference to FIGS. 7A and 7B. Note that FIG. 7B shows the potentials of the scan lines 4_2, 5_2, and 6_2 and the inverted scan line 7_2, which are provided in the second row in the pixel portion, and the nodes D to F. In FIG. 7B, signals input to the respective wirings are provided in parentheses.

In the period ta, the selection signal is input to the scan line 4_2 and is not input to the scan lines 5_2 and 6_2 and the inverted scan line 7_2. Thus, the transistor 15 is turned on and the transistors 11, 12, 14, and 16 are turned off, so that the node F becomes at a potential of V0.

In the period tb, the selection signal is input to the scan line 5_2. Accordingly, the transistors 12 and 14 are turned on, so that the node D and the node E become at a potential of V1 and at a potential of V0, respectively. In response to the change of the potential of the node D to the potential V1, the transistor 13 is turned on.

In the period tc, the input of the selection signal to the scan line 4_2 is stopped. Accordingly, the transistor 15 is turned off. Here, the transistor 13 remains on until the voltage between the gate and the source becomes lower than or equal to the threshold voltage. In other words, the transistor 13 remains on until the potentials of the nodes E and F (the source of the transistor 13) become lower than the potential of the node D (potential V1) by the threshold voltage of the transistor 13 (Vth13). Consequently, the potentials of the nodes E and F become the above values.

In the period td, the input of the selection signal to the scan line 5_2 is stopped. Accordingly, the transistors 12 and 14 are turned off.

In the period te, the selection signal is input to the scan line 6_2. Accordingly, the transistor 11 is turned on. Assume that the potential (Vdata) of an image signal is supplied to the signal line 8. Thus, the node E becomes at the potential (Vdata) of the image signal. In addition, the potentials of the nodes D and F are also changed owing to the potential of the node E. Specifically, the potential of the node D in a floating state is raised or lowered by the amount of change in potential of the node E (the difference between the potential (Vdata) of the image signal and the potential lower than the potential V1 by the threshold voltage of the transistor 13 (Vth13)) owing to the capacitive coupling between the node D and the node E through the capacitor 17 (the potential of the node D becomes V1+[Vdata−(V1−Vth13)]=Vdata+Vth13); and the potential of the node F in a floating state is raised or lowered by the amount of change in potential of the node E owing to the capacitive coupling between the node E and the node F through the capacitor 18 (the potential of the node F becomes V1−Vth13+[Vdata−(V1−Vth13)]=Vdata).

In the period tf, the selection signal is input to the scan line 4_2. Accordingly, the transistor 15 is turned on, so that the node F becomes at a potential of V0.

In the period tg, the input of the selection signal to the scan line 4_2 is stopped. Accordingly, the transistor 15 is turned off.

In the period th, the selection signal is input to the inverted scan line 7_2. Accordingly, the transistor 16 is turned on, so that a current depending on the voltage between the gate and the source of the transistor 13 is supplied to the organic EL element 19. Here, the voltage corresponds to the difference between the potential of the node D (Vdata+Vth13) and the potential of the node F. In this case, the current supplied to the organic EL element 19 (the drain current in a saturated region of the transistor 13) is not dependent on the threshold voltage of the transistor 13.

Through the above operations, the pixels 10 display an image in accordance with the potential (Vdata) of the image signal. In the operation example of the pixel, current can be supplied to the organic EL element 19 without dependence on the threshold voltage of the transistor 13 provided in the pixel 10. Thus, even when the threshold voltages vary among the transistors 13 included in the plurality of pixels in the display device disclosed in this specification, it is possible to reduce a deterioration in display quality.

<Display Device Disclosed in this Specification>

In the display device disclosed in this specification, the operation of the inverted pulse output circuits is controlled by a plurality of kinds of signals. Thus, through current generated in the inverted pulse output circuits can be reduced. Further, signals used for the operation of the plurality of pulse output circuits are used as the plurality of kinds of signals. That is, the inverted pulse output circuits can be operated without generating a signal additionally.

MODIFICATION EXAMPLES

The above display device is one embodiment of the present invention; the present invention also includes a display device that has a structure different from the structure of the above display device. Descriptions will be given below of examples of another embodiment of the present invention. Note that the present invention also includes a display device having any of the following plurality of elements given as the examples of another embodiment of the present invention.

<Modification Example of Display Device>

As the above display device, the display device including the organic EL element in each pixel (hereinafter also referred to as an EL display device) has been exemplified; however, the display device of the present invention is not limited to the EL display device. For example, the display device of the present invention may be a display device that displays an image by controlling the alignment of liquid crystals (liquid crystal display device).

<Modification Example of Scan Line Driver Circuit>

The configuration of the above scan line driver circuit is not limited to that in FIG. 2. For example, it is possible to use a scan line driver circuit in FIG. 8 as the scan line driver circuit included in the above display device.

Figure 8:
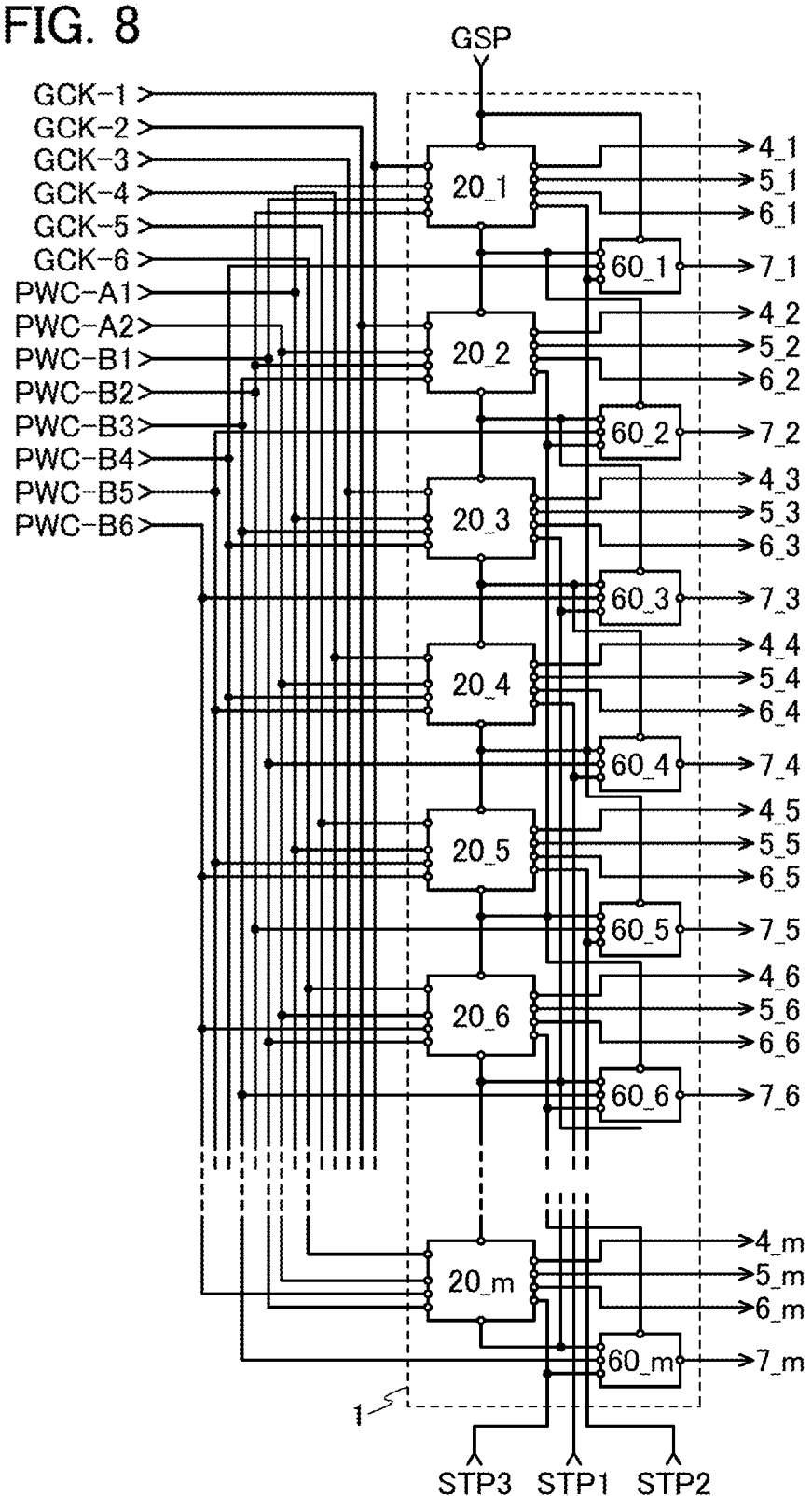
FIG. 8 illustrates a configuration example of a scan line driver circuit.

The scan line driver circuit in FIG. 8 is different from the scan line driver circuit in FIG. 2 in that the wirings that supply the first to third pulse width control signals C (PWC-C1) to (PWC-C3) are not provided. Note that the connections of the terminals 25 of the first to m-th pulse output circuits 20_1 to 20_m included in the scan line driver circuit in FIG. 8 are as follows (for the terminal 25, see FIG. 4A).

The terminal 25 of the (6a−5)-th pulse output circuit 20_6a−5 (a is a natural number less than or equal to m/6) is electrically connected to the wiring that supplies the second pulse width control signal B (PWC-B2); the terminal 25 of the (6a−4)-th pulse output circuit 20_6a−4 is electrically connected to the wiring that supplies the third pulse width control signal B (PWC-B3); the terminal 25 of the (6a−3)-th pulse output circuit 20_6a−3 is electrically connected to the wiring that supplies the fourth pulse width control signal B (PWC-B4); the terminal 25 of the (6a−2)-th pulse output circuit 20_6a−2 is electrically connected to the wiring that supplies the fifth pulse width control signal B (PWC-B5); the terminal 25 of the (6a−1)-th pulse output circuit 20_6a−1 is electrically connected to the wiring that supplies the sixth pulse width control signal B (PWC-B6); and the terminal 25 of the sixth pulse output circuit 20_6a is electrically connected to the wiring that supplies the first pulse width control signal B (PWC-B1).

The scan line driver circuit in FIG. 8 can operate in a manner similar to that of the scan line driver circuit in FIG. 2. The number of wirings and the number of signals for the scan line driver circuit in FIG. 8 can be set to smaller than those for the scan line driver circuit in FIG. 2. On the other hand, the scan line driver circuit in FIG. 2 can reduce a delay of the selection signal supplied to the scan line 5 and the scan line 6 much more than the scan line driver circuit in FIG. 8. Specifically, in the scan line driver circuit in FIG. 2, the wiring that supplies the selection signal for the scan line 5 and the wiring that supplies the selection signal for the scan line 6 are provided separately, whereas in the scan line driver circuit in FIG. 8, one wiring which functions as the above wirings is provided. Thus, the scan line driver circuit in FIG. 8 has a higher load at the time of supplying the selection signals to the scan line 4 and the scan line 5 than the scan line driver circuit in FIG. 2.

<Modification Examples of Pulse Output Circuit>

The configuration of the pulse output circuit included in the above scan line driver circuit is not limited to that in FIG. 5A. For example, it is possible to use any of pulse output circuits in FIGS. 9A and 9B, FIG. 10, and FIG. 11 as the pulse output circuit included in the above scan line driver circuit.

Figure 9A:
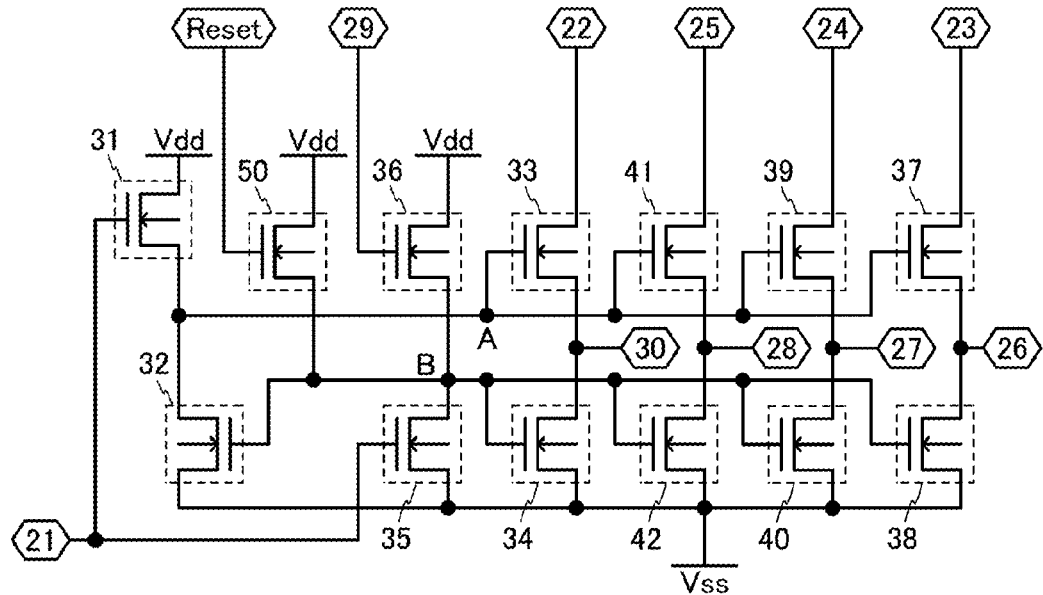
FIGS. 9A and 9B illustrate configuration examples of pulse output circuits.

The pulse output circuit in FIG. 9A has a configuration in which a transistor 50 is added to the pulse output circuit in FIG. 5A. One of a source and a drain of the transistor 50 is electrically connected to the high power supply potential line; the other of the source and the drain of the transistor 50 is electrically connected to the node B; and a gate of the transistor 50 is electrically connected to a reset terminal (Reset). Note that to the reset terminal (Reset), a high-level potential can be input in a vertical retrace period of the display device and a low-level potential can be input in periods other than the vertical retrace period. Thus, the potential of each node of the pulse output circuit can be initialized, leading to prevention of malfunction.

Figure 9B:
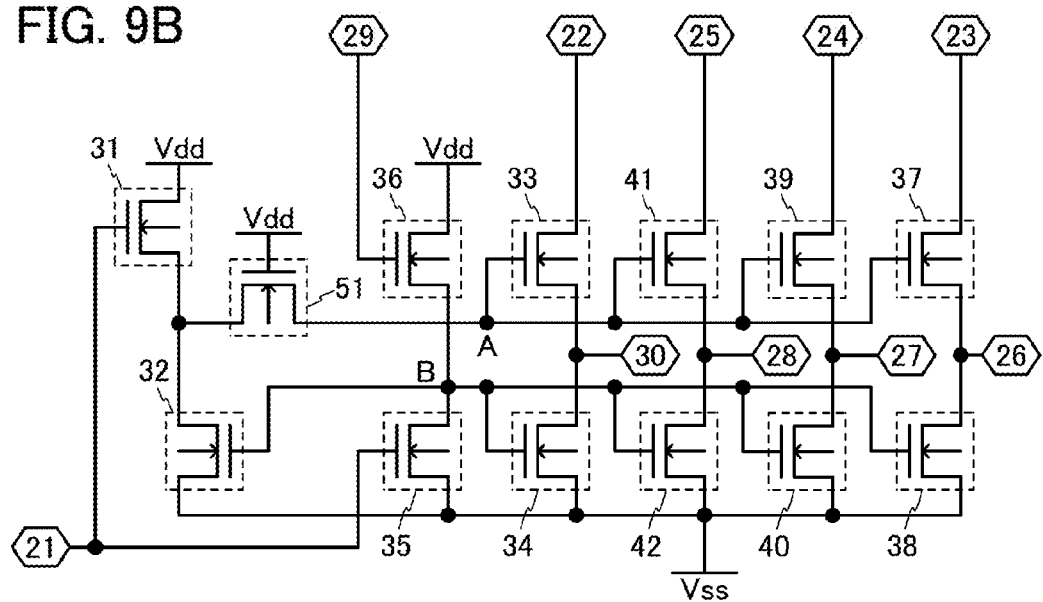

The pulse output circuit in FIG. 9B has a configuration in which a transistor 51 is added to the pulse output circuit in FIG. 5A. One of a source and a drain of the transistor 51 is electrically connected to the other of the source and the drain of the transistor 31 and the other of the source and the drain of the transistor 32; the other of the source and the drain of the transistor 51 is electrically connected to the gate of the transistor 33, the gate of the transistor 37, the gate of the transistor 39, and the gate of the transistor 41; and a gate of the transistor 51 is electrically connected to the high power supply potential line. Note that the transistor 51 is off in a period when the node A is at a high-level potential (the periods t1 to t3 in FIG. 5B). Therefore, the configuration in which the transistor 51 is added makes it possible to interrupt electrical connections of the gate of the transistor 33, the gate of the transistor 37, the gate of the transistor 39, the gate of the transistor 41, the other of the source and the drain of the transistor 31, and the other of the source and the drain of the transistor 32 in the periods t1 to t3. Thus, a load at the time of the bootstrapping in the pulse output circuit can be reduced in the periods t1 to t3.

Figure 10:
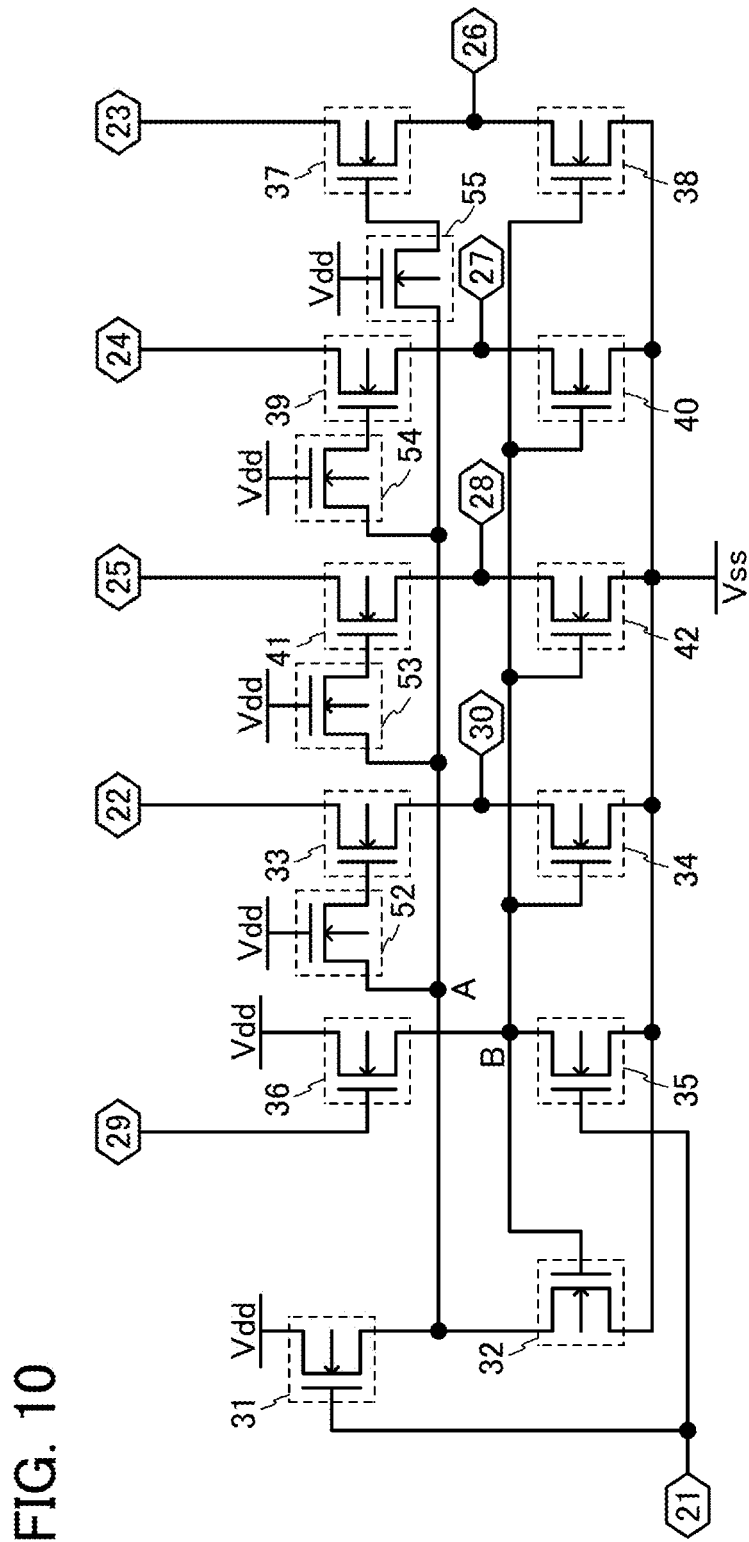
FIG. 10 illustrates a configuration example of a pulse output circuit.

The pulse output circuit in FIG. 10 has a configuration in which transistors 52 to 55 are added to the pulse output circuit in FIG. 5A. One of a source and a drain of the transistor 52 is electrically connected to the gate of the transistor 33; the other of the source and the drain of the transistor 52 is electrically connected to the other of the source and the drain of the transistor 31 and the other of the source and the drain of the transistor 32; and a gate of the transistor 52 is electrically connected to the high power supply potential line. One of a source and a drain of the transistor 53 is electrically connected to the gate of the transistor 41; the other of the source and the drain of the transistor 53 is electrically connected to the other of the source and the drain of the transistor 31 and the other of the source and the drain of the transistor 32; and a gate of the transistor 53 is electrically connected to the high power supply potential line. One of a source and a drain of the transistor 54 is electrically connected to the gate of the transistor 39; the other of the source and the drain of the transistor 54 is electrically connected to the other of the source and the drain of the transistor 31 and the other of the source and the drain of the transistor 32; and a gate of the transistor 54 is electrically connected to the high power supply potential line. One of a source and a drain of the transistor 55 is electrically connected to the gate of the transistor 37; the other of the source and the drain of the transistor 55 is electrically connected to the other of the source and the drain of the transistor 31 and the other of the source and the drain of the transistor 32; and a gate of the transistor 55 is electrically connected to the high power supply potential line. Note that the configuration in which the transistors 52 to 55 are additionally provided as described above makes it possible to reduce a load at the time of the bootstrapping in the pulse output circuit.

Figure 11:
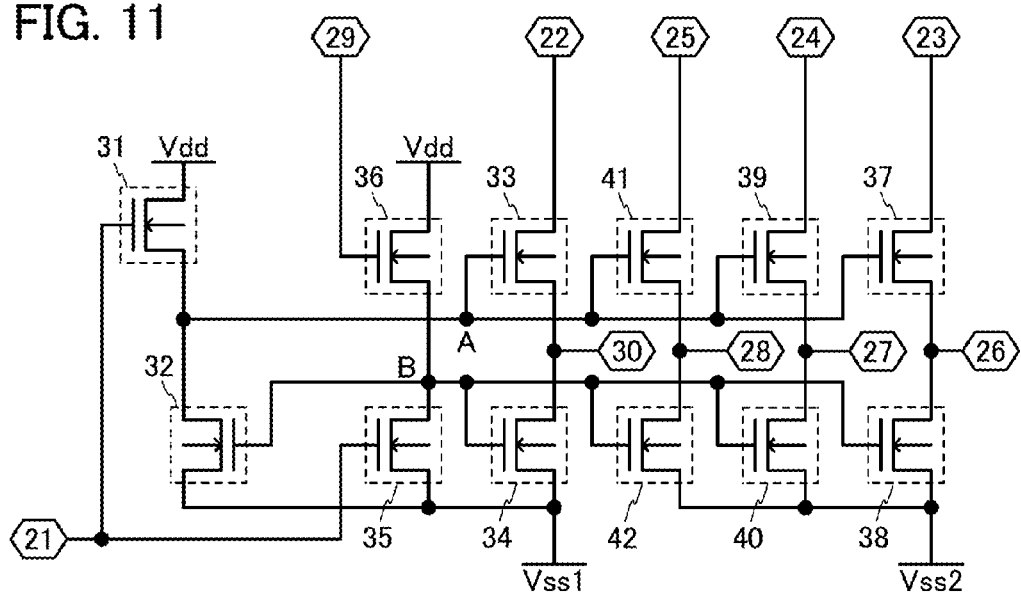
FIG. 11 illustrates a configuration example of a pulse output circuit.

The pulse output circuit in FIG. 11 has a configuration in which the function of the wiring that supplies the low power supply potential in the pulse output circuit in FIG. 5A is performed by two wirings. Specifically, the pulse output circuit in FIG. 11 includes a wiring that supplies a low power supply potential (Vss1) and is electrically connected to the one of the source and the drain of the transistor 32, the one of the source and the drain of the transistor 34, and the one of the source and the drain of the transistor 35; and a wiring that supplies a low power supply potential (Vss2) and is electrically connected to the one of the source and the drain of the transistor 38, the one of the source and the drain of the transistor 40, and the one of the source and the drain of the transistor 42. Briefly, the former supplies the low power supply potential to a portion which contributes to the shift of a shift pulse in the pulse output circuit, and the latter supplies the low power supply potential to a portion which contributes to the supply of a potential to the scan line in the pulse output circuit. In the pulse output circuit in FIG. 11, even when the potential of the wiring that supplies the low power supply potential (Vss2) changes, the potential of the wiring that supplies the low power supply potential (Vss1) does not change. Thus, a shift pulse can be reliably shifted in the pulse output circuit.

Note that some of the elements described in the modification examples may be used in combination for the pulse output circuit in FIG. 5A.

<Modification Examples of Inverted Pulse Output Circuit>

The configuration of the inverted pulse output circuit included in the above scan line driver circuit is not limited to that in FIG. 6A. For example, any of inverted pulse output circuits in FIGS. 12A and 12B can be used as the inverted pulse output circuit included in the above scan line driver circuit.

Figure 12A:
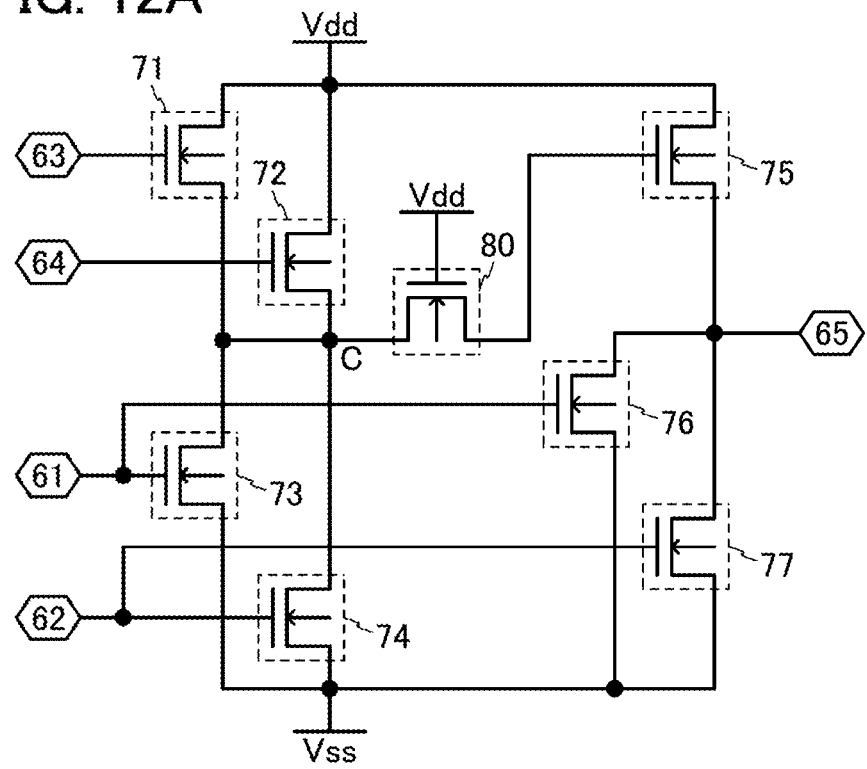
FIGS. 12A and 12B illustrate configuration examples of inverted pulse output circuits.

The pulse output circuit in FIG. 12A has a configuration in which a transistor 80 is added to the inverted pulse output circuit in FIG. 6A. One of a source and a drain of the transistor 80 is electrically connected to the other of the source and the drain of the transistor 71, the other of the source and the drain of the transistor 72, the other of the source and the drain of the transistor 73, and the other of the source and the drain of the transistor 74; the other of the source and the drain of the transistor 80 is electrically connected to the gate of the transistor 75; and a gate of the transistor 80 is electrically connected to the high power supply potential line.

Figure 12B:
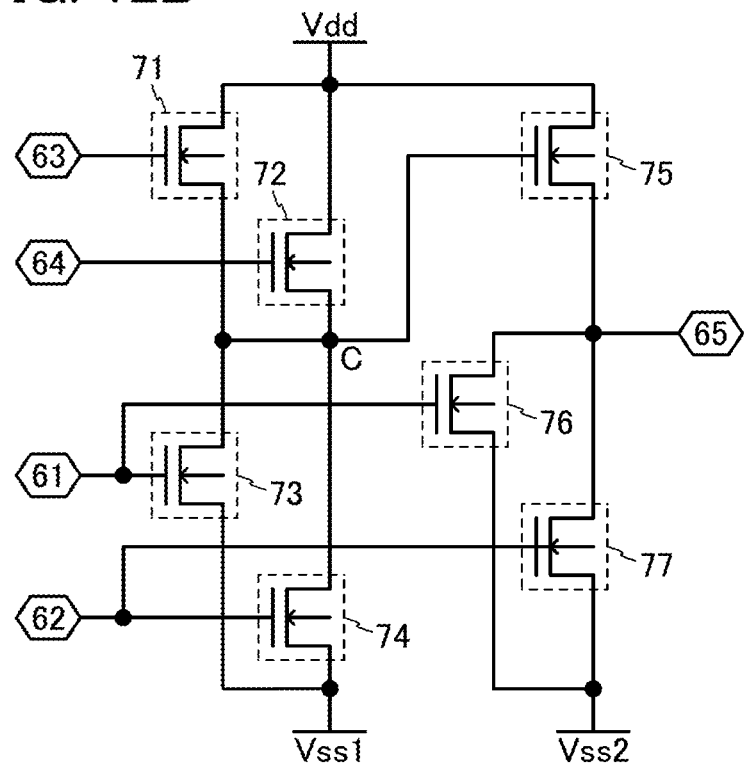

The inverted pulse output circuit in FIG. 12B has a configuration in which the function of the wiring that supplies the low power supply potential in the inverted pulse output circuit in FIG. 6A is performed by two wirings. Specifically, the inverted pulse output circuit in FIG. 12B includes a wiring that supplies the low power supply potential (Vss1) and is electrically connected to the one of the source and the drain of the transistor 73 and the one of the source and the drain of the transistor 74; and a wiring that supplies the low power supply potential (Vss2) and is electrically connected to the one of the source and the drain of the transistor 76 and the one of the source and the drain of the transistor 77.

Note that some of the elements described in the modification examples may be used in combination for the inverted pulse output circuit in FIG. 6A.

[Modification Examples of Pixel]

The configuration of the pixel included in the above display device is not limited to that in FIG. 7A. For example, although the pixel in FIG. 7A is formed using only n-channel transistors, the present invention is not limited to this configuration. That is, in the display device of one embodiment of the invention, the pixel can alternatively be formed using only p-channel transistors or n-channel transistors and p-channel transistors in combination.

Note that, as illustrated in FIG. 7A, when the transistors provided in the pixel are of only one conductivity type, high integration of the pixels can be achieved. This is because in the case where different conductivity types are given to transistors by implanting impurities to semiconductor layers, a gap (margin) needs to be provided between an n-channel transistor and a p-channel transistor. In contrast, the gap is unnecessary in the case where the pixel is formed using transistors of only one conductivity type.

<Various Kinds of Electronic Devices Including Liquid Crystal Display Devices>

Examples of electronic devices each including the liquid crystal display device disclosed in this specification will be described below with reference to FIGS. 13A to 13F.

Figure 13A:
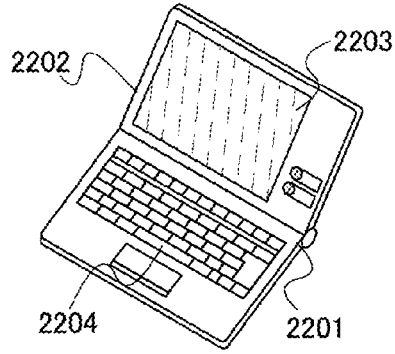
FIGS. 13A to 13F illustrate examples of electronic devices.

FIG. 13A illustrates a laptop computer including a main body 2201, a housing 2202, a display portion 2203, a keyboard 2204, and the like.

Figure 13B:
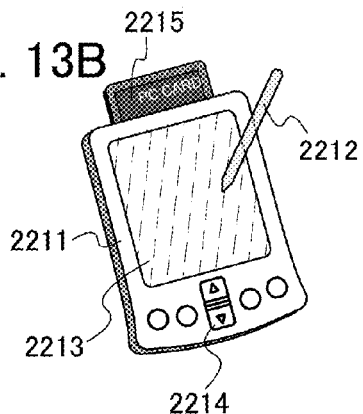

FIG. 13B illustrates a personal digital assistant (PDA) including a main body 2211 provided with a display portion 2213, an external interface 2215, an operation button 2214, and the like. A stylus 2212 is an accessory used for operation.

Figure 13C:
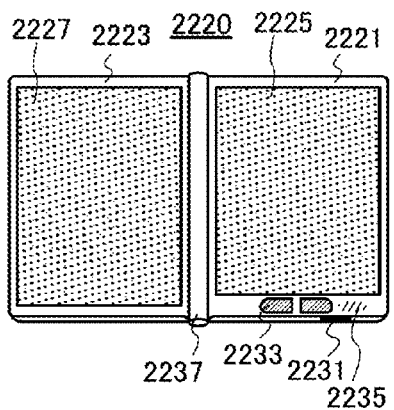

FIG. 13C illustrates an e-book reader 2220 as an example of electronic paper. The e-book reader 2220 includes two housings, a housing 2221 and a housing 2223. The housings 2221 and 2223 are combined with each other with an axis portion 2237 along which the e-book reader 2220 can be opened and closed. With such a structure, the e-book reader 2220 can be used like paper books.

A display portion 2225 is incorporated in the housing 2221, and a display portion 2227 is incorporated in the housing 2223. The display portion 2225 and the display portion 2227 may display one image or different images. In the structure where the display portions display different images, for example, the right display portion (the display portion 2225 in FIG. 13C) can display text and the left display portion (the display portion 2227 in FIG. 13C) can display images.

In FIG. 13C, the housing 2221 is provided with an operation portion and the like. For example, the housing 2221 is provided with a power source 2231, an operation key 2233, a speaker 2235, and the like. With the operation key 2233, pages can be turned. Note that a keyboard, a pointing device, or the like may also be provided on the surface of the housing on which the display portion is provided. Further, an external connection terminal (an earphone terminal, a USB terminal, a terminal that can be connected to an AC adapter or various cables such as a USB cable, or the like), a recording medium insertion portion, and the like may be provided on the back surface or the side surface of the housing. Furthermore, the e-book reader 2220 may have a function of an electronic dictionary.

The e-book reader 2220 may be configured to transmit and receive data wirelessly. Through wireless communication, desired book data or the like can be purchased and downloaded from an electronic book server.

Note that electronic paper can be used as devices in a variety of fields as long as they display information. For example, electronic paper can be used for posters, advertisement in vehicles such as trains, display in a variety of cards such as credit cards, and the like in addition to e-book readers.

Figure 13D:
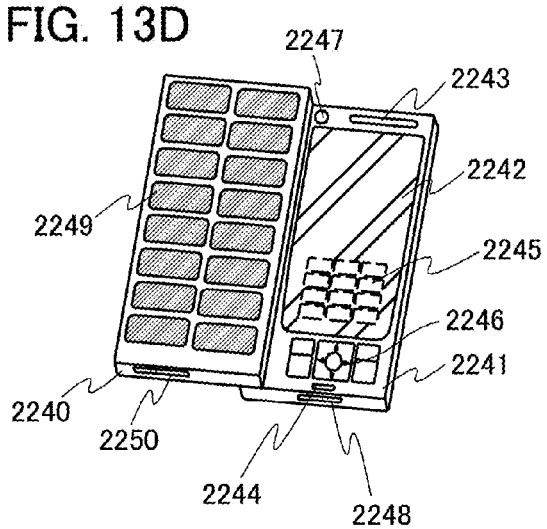

FIG. 13D illustrates a mobile phone. The mobile phone includes two housings: housings 2240 and 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 which stores electricity in the mobile phone, an external memory slot 2250, and the like. An antenna is incorporated in the housing 2241.

The display panel 2242 has a touch panel function. A plurality of operation keys 2245 which is displayed as images is illustrated by dashed lines in FIG. 13D. Note that the mobile phone includes a booster circuit for increasing a voltage output from the solar cell 2249 to a voltage needed for each circuit. Moreover, the mobile phone can incorporate a contactless IC chip, a small recording device, or the like in addition to the above structure.

The display orientation of the display panel 2242 changes as appropriate depending on a usage pattern. Further, the display device is provided with the camera lens 2247 on the surface on which the display panel 2242 is provided, and thus it can be used as a video phone. The speaker 2243 and the microphone 2244 can be used for videophone calls, recording and playing sound, and the like as well as voice calls. Moreover, the housings 2240 and 2241 in a state where they are opened as illustrated in FIG. 13D can be slid so that one overlaps the other; therefore, the size of the mobile phone can be reduced, which makes the mobile phone suitable for being carried.

The external connection terminal 2248 can be connected to an AC adapter or various types of cables such as a USB cable, and charging or data communication is possible. Moreover, a larger amount of data can be saved and moved by inserting a recording medium to the external memory slot 2250. Further, in addition to the above functions, an infrared communication function, a television reception function, or the like may be provided.

Figure 13E:
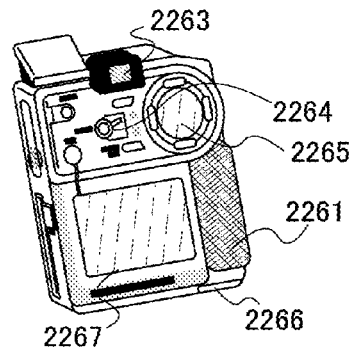

FIG. 13E illustrates a digital video camera including a main body 2261, a display portion A 2267, an eyepiece 2263, an operation switch 2264, a display portion B 2265, a battery 2266, and the like.

Figure 13F:
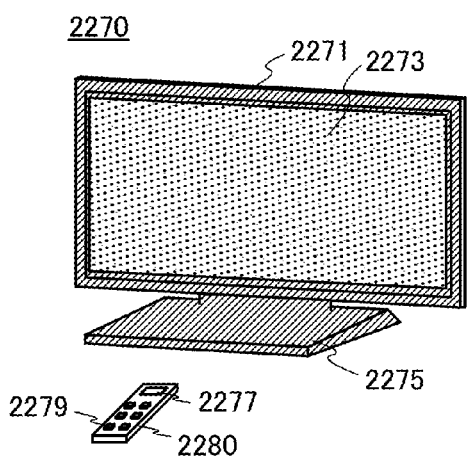

FIG. 13F illustrates an example of a television set. In a television set 2270, a display portion 2273 is incorporated in a housing 2271. The display portion 2273 can display images. Here, the housing 2271 is supported by a stand 2275.

The television set 2270 can be operated by an operation switch of the housing 2271 or a separate remote controller 2280. Channels and volume can be controlled with an operation key 2279 of the remote controller 2280 so that an image displayed on the display portion 2273 can be controlled. Further, the remote controller 2280 may be provided with a display portion 2277 for displaying data output from the remote controller 2280.

Note that the television set 2270 is preferably provided with a receiver, a modem, and the like. With the use of the receiver, general television broadcasting can be received. Furthermore, when the television set is connected to a communication network with or without wires via the modem, one-way (from a sender to a receiver) or two-way (between a sender and a receiver or between receivers) data communication can be performed.

EXPLANATION OF REFERENCE

1: scan line driver circuit, 2: signal line driver circuit, 3: current source, 4 to 6: scan line, 7: inverted scan line, 8: signal line, 9: power supply line, 10: pixel, 11 to 16: transistor, 17 and 18: capacitor, 19: organic EL element, 20: pulse output circuit, 21 to 30: terminal, 31 to 42: transistor, 50 to 55: transistor, 60: inverted pulse output circuit, 61 to 65: terminal, 71 to 77: transistor, 80: transistor, 2201: main body, 2202: housing, 2203: display portion, 2204: keyboard, 2211: main body, 2212: stylus, 2213: display portion, 2214: operation button, 2215: external interface, 2220: e-boon reader, 2221: housing, 2223: housing, 2225: display portion, 2227: display portion, 2231: power source, 2233: operation key, 2235: speaker, 2237: axis portion, 2240: housing, 2241: housing, 2242: display panel, 2243: speaker, 2244: microphone, 2245: operation key, 2246: pointing device, 2247: camera lens, 2248: external connection terminal, 2249: solar cell, 2250: external memory slot, 2261: main body, 2263: eyepiece, 2264: operation switch, 2265: display portion B, 2266: battery, 2267: display portion A, 2270: television set, 2271: housing, 2273: display portion, 2275: stand, 2277: display portion, 2279: operation key, and 2280: remote controller This application is based on Japanese Patent Application serial no. 2011-261106 filed with the Japan Patent Office on Nov. 30, 2011, the entire contents of which are hereby incorporated by reference.

The invention claimed is:

1. A display device comprising:
a plurality of pixels arranged in m rows and n columns (m and n are natural numbers greater than or equal to 4);
respective first to m-th scan lines which are electrically connected to the n pixels arranged in respective first to m-th rows;
respective first to m-th inverted scan lines which are electrically connected to the n pixels arranged in respective first to m-th rows; and
a shift register electrically connected to the first to m-th scan lines and the first to m-th inverted scan lines, wherein the pixels arranged in the k-th row (k is a natural number less than or equal to m) each include:
   a first switch which is turned on by an input of a selection signal to the k-th scan line, and
   a second switch which is turned on by an input of a selection signal to the k-th inverted scan line, and
wherein the shift register includes:
   first to m-th pulse output circuits, and
   first to m-th inverted pulse output circuits,
   wherein to the s-th (s is a natural number less than or equal to (m−2)) pulse output circuit, a start pulse is input (only in a case where s is 1) or a shift pulse output from the (s−1)-th pulse output circuit is input, and the s-th pulse output circuit outputs a selection signal to the s-th scan line and outputs a shift pulse to the (s+1)-th pulse output circuit,
   wherein the s-th pulse output circuit includes a first transistor and a second transistor which are turned on by an input of the start pulse or the shift pulse output from the (s−1)-th pulse output circuit and are in an on state until a first period ends,
   wherein in the first period, by using at least one of capacitive coupling between a gate and a source of the first transistor and capacitive coupling between a gate and a source of the second transistor, the s-th pulse output circuit supplies, as a selection signal, a potential which is the same or substantially the same as the potential supplied to a drain of the first transistor, from the source of the first transistor, and supplies, as a shift pulse, a potential which is the same or substantially the same as the potential supplied to a drain of the second transistor, from the source of the second transistor,
   wherein to the s-th inverted pulse output circuit, the start pulse (only in the case where s is 1) or the shift pulse output from the (s−1)-th pulse output circuit is input, and the s-th inverted pulse output circuit outputs a selection signal to the s-th inverted scan line,
   wherein the s-th inverted pulse output circuit includes a third transistor which is turned off by an input of the start pulse or the shift pulse output from the (s−1)-th pulse output circuit and is in an off state until a second period ends,
   wherein after the second period, the s-th inverted pulse output circuit supplies a selection signal to the s-th inverted scan line from a source of the third transistor, and
   wherein the first period corresponds to or is included in the second period.

2. The display device according to claim 1,
wherein a period in which the s-th pulse output circuit outputs the shift pulse overlaps with a period in which the (s+1)-th pulse output circuit outputs the shift pulse.

3. The display device according to claim 1,
wherein the transistors included in the pixel have the same conductivity types.

4. The display device according to claim 1,
wherein the pixel includes:
   an organic electroluminescent element which emits light in accordance with a supplied current, and
   a driving transistor which supplies a current to the organic electroluminescent element from a source, and
wherein a current supplied to the organic electroluminescent element does not depend on a threshold voltage of the driving transistor.

5. A display device comprising:
a plurality of pixels arranged in m rows and n columns (m and n are natural numbers greater than or equal to 4);
respective first to m-th scan lines A which are electrically connected to the n pixels arranged in respective first to m-th rows;
respective first to m-th scan lines B which are electrically connected to the n pixels arranged in respective first to m-th rows;
respective first to m-th scan lines C which are electrically connected to the n pixels arranged in respective first to m-th rows;
respective first to m-th inverted scan lines which are electrically connected to the n pixels arranged in respective first to m-th rows; and
a shift register electrically connected to the first to m-th scan lines A, the first to m-th scan lines B, and the first to m-th scan lines C and the first to m-th inverted scan lines,
wherein the pixels arranged in the k-th row (k is a natural number less than or equal to m) each include:
   a first switch which is turned on by an input of a selection signal to the k-th scan line A,
   a second switch which is turned on by an input of a selection signal to the k-th scan line B,
   a third switch which is turned on by an input of a selection signal to the k-th scan line C, and
   a fourth switch which is turned on by an input of a selection signal to the k-th inverted scan line, and
wherein the shift register includes:
   first to m-th pulse output circuits, and
   first to m-th inverted pulse output circuits,
   wherein to the s-th (s is a natural number less than or equal to (m−2)) pulse output circuit, a start pulse is input (only in a case where s is 1) or a shift pulse output from the (s−1)-th pulse output circuit is input, and the s-th pulse output circuit outputs a selection signal to the s-th scan lines A, B, and C and outputs a shift pulse to the (s+1)-th pulse output circuit,
   wherein the s-th pulse output circuit includes first to fourth transistors which are turned on by an input of the start pulse or the shift pulse output from the (s−1)-th pulse output circuit and are in an on state until a first period ends,
   wherein in the first period, by using at least one of capacitive coupling between a gate and a source of the first transistor, capacitive coupling between a gate and a source of the second transistor, capacitive coupling between a gate and a source of the third transistor, and capacitive coupling between a gate and a source of the fourth transistor, the s-th pulse output circuit supplies, as a selection signal for the s-th scan line A, a potential which is the same or substantially the same as the potential supplied to a drain of the first transistor, from the source of the first transistor, supplies, as a selection signal for the s-th scan line B, a potential which is the same or substantially the same as the potential supplied to a drain of the second transistor, from the source of the second transistor, supplies, as a selection signal for the s-th scan line C, a potential which is the same or substantially the same as the potential supplied to a drain of the third transistor, from the source of the third transistor, and supplies, as a shift pulse, a potential which is the same or substantially the same as the potential supplied to a drain of the fourth transistor, from a source of the fourth transistor,
   wherein to the s-th inverted pulse output circuit, the start pulse (only in the case where s is 1) or the shift pulse output from the (s−1)-th pulse output circuit is input, and the s-th inverted pulse output circuit outputs a selection signal to the s-th inverted scan line, wherein the s-th inverted pulse output circuit includes a fifth transistor which is turned off by an input of the start pulse or the shift pulse output from the (s−1)-th pulse output circuit and is in an off state until a second period ends, wherein after the second period, the s-th inverted pulse output circuit supplies a selection signal to the s-th inverted scan line from a source of the fifth transistor, and wherein the first period corresponds to or is included in the second period.

6. The display device according to claim 5, wherein a period in which the s-th pulse output circuit outputs the shift pulse overlaps with a period in which the (s+1)-th pulse output circuit outputs the shift pulse.

7. The display device according to claim 5, wherein the transistors included in the pixel have the same conductivity types.

8. The display device according to claim 5, wherein the pixel includes:
   an organic electroluminescent element which emits light in accordance with a supplied current, and
   a driving transistor which supplies a current to the organic electroluminescent element from a source, and wherein a current supplied to the organic electroluminescent element does not depend on a threshold voltage of the driving transistor.

* * * * *